United States Patent
Leong et al.

(12)

(10) Patent No.: US 10,289,137 B2
(45) Date of Patent: May 14, 2019

(54) SYSTEM AND METHOD FOR A CURRENT CONTROLLER

(71) Applicant: Infineon Technologies Austria AG, Villach (AT)

(72) Inventors: Kenneth Kin Leong, Villach (AT); Gerald Deboy, Klagenfurt (AT); Sebastian Uitz, Villach (AT); Juan Sanchez, Villach (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 264 days.

(21) Appl. No.: 15/287,442

(22) Filed: Oct. 6, 2016

(65) Prior Publication Data
US 2018/0102774 A1   Apr. 12, 2018

(51) Int. Cl.
*G05F 1/56* (2006.01)
*H03K 17/082* (2006.01)
*H03K 17/16* (2006.01)

(52) U.S. Cl.
CPC ........... *G05F 1/56* (2013.01); *H03K 17/0822* (2013.01); *H03K 17/166* (2013.01)

(58) Field of Classification Search
CPC ..... H03K 17/0822; H03K 17/166; G05F 1/56
USPC ........................................................ 327/543
See application file for complete search history.

(56) References Cited

U.S. PATENT DOCUMENTS

2014/0084994 A1* 3/2014 Merkin ..................... G05F 1/56
327/543

OTHER PUBLICATIONS

Schoiswohl, J., "Linear Mode Operation and Safe Operating Diagram of Power-MOSFETs," Infineon Technologies AG, Application Note, V0.92, Jun. 2010, pp. 1-13.
Texas Instruments, LM5066 10 to 80 V, Hotswap Controller With I/V/P Monitoring and PMBus Interface, SNVS655H, Jun. 2011, Revised Jul. 2014, pp. 1-66.

* cited by examiner

*Primary Examiner* — Thomas Skibinski
(74) *Attorney, Agent, or Firm* — Slater Matsil, LLP

(57) ABSTRACT

In accordance with an embodiment of the present invention, a method of controlling current through a transistor includes measuring a voltage across the transistor, measuring a current through the transistor, determining a safe operating current for the measured voltage across the transistor, and adjusting a voltage of a control node of the transistor using a feedback controller until the measured current through the transistor is not greater than the determined safe operating current.

27 Claims, 16 Drawing Sheets

SYSTEM AND METHOD FOR A CURRENT CONTROLLER

TECHNICAL FIELD

The present invention relates generally to an electronic circuit, and, in particular embodiments, to a system and method for a current controller.

BACKGROUND

In various complex electronic systems, it is desirable to repair a working system or change the configuration of the system without interrupting the operation of the system. To this end, various components or peripherals of the system may be configured to be hot-swappable. What this means is that these various components or peripherals may be removed and installed while the rest of the system is still operational. This may occur, for example, in systems such as large computer servers or cloud storage systems that need to remain operational even during times when the system needs to be maintained or repaired.

Hot-swappable components are configured to be inserted and removed in fully operational systems in which power is applied. In order to support the ability to insert and remove these components from a live power supply, each hot-swappable component typically includes power supply protection circuitry that prevents damage to the components of the component or peripheral, and allows for the orderly startup and shutdown of the hot-swappable component or peripheral.

One of the issues encountered in the design of hot-swappable components is effectively dealing with the issue of inrush current. In many situations, the power supply bus of the hot-swappable component includes a very large amount of capacitance. When this high capacitance component is plugged in to the system, a very large amount of current may flow in order to initially charge the large capacitance. In many hot-swappable systems, this inrush current is controlled by including a series element that provides resistance and or controls the flow of current when the hot-swappable component is initially plugged into the system. Such a series element may be implemented for example using a power transistor such as a power MOSFET that is initially configured to have a high resistance during startup and then transitions to a much lower resistance during operation.

In order to deal with very large amounts of current power, MOSFETs that are used as series elements and hot-swappable components are generally very large in order to make sure that inrush currents do not exceed the power MOSFET's ability to handle currents. However, it is not uncommon for such power MOSFETs to fail in the field due to inrush currents being over the maximum amount that can be handled by the device, or fail due to the temperature of the device being over its thermal limit.

SUMMARY

In accordance with an embodiment of the present invention, a method of controlling current through a transistor includes measuring a voltage across the transistor, measuring a current through the transistor, determining a safe operating current for the measured voltage across the transistor, and adjusting a voltage of a control node of the transistor using a feedback controller until the measured current through the transistor is not greater than the determined safe operating current.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1b and 1c illustrate graphs relating to the performance of the exemplary inrush control circuit of FIG. 1a;

FIGS. 2b and 2c illustrate graphs relating to the performance of the exemplary inrush control circuit of FIG. 1a;

FIGS. 7b and 7c illustrate waveform diagrams representing the performance of the embodiment method of FIG. 7a;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for controlling the inrush current for a circuit component such as a hot-swappable circuit board. However, embodiments may also be directed toward other electronic circuits in the areas of electronic fuses, power supply circuits, and other systems that utilize current limiting.

In various embodiments of the present invention, a system for controlling inrush current includes a series transistor that may be connected in series with the power supply connection of a hot-swappable component. A controller measures the voltage across the series transistor and determines a corresponding maximum safe current that may be conducted by the transistor based on the measured voltage across the series transistor. A feedback controller is used to servo the current conducted by the series transistor to correspond to the determined maximum safe operating current.

In some embodiments, this maximum safe operating current may correspond to a DC current, or may correspond to a pulsed or transient current according to a safe operating area profile. Because the maximum safe operating current under transient or pulse conditions may be higher than a maximum safe DC current, the charging time of the hot-swappable component may be decreased by turning-on the series transistor for a limited amount of time over a series of pulses in order to take advantage of the higher safe operating currents. The charging time may be further improved or optimized by controlling the series component according to an inrush vs voltage trajectory that reduces or minimizes the charging time of the hot-swappable component while keeping the current though the series transistor within the bounds of the safe operating area of the device.

Advantages of embodiments of the present invention include increased reliability of hot-swappable components, as well as the ability to ensure reliable operation without needing to over specify the size of the series transistor. By using a smaller series transistor, system cost may be reduced.

Figure 1A:
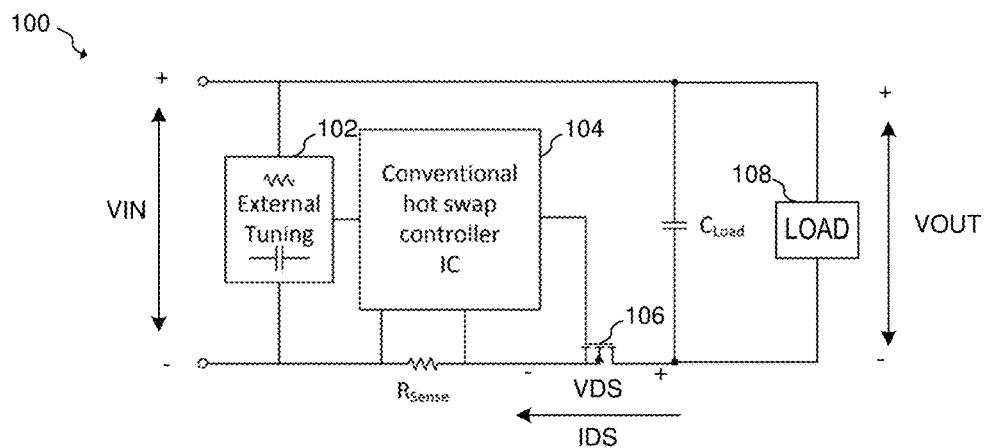
FIG. 1a illustrates an exemplary inrush control circuit for a hot swappable system.

FIG. 1a illustrates exemplary inrush current control system 100 that limits the amount of inrush current IDS through transistor 106. As shown in FIG. 1a, current IDS is the current that flows between the drain and source terminals of transistor 106. The path between the drain and source of transistor 106 may also be referred to as a "load path," which is the path in which the controlled current of a transistor flows during operation. Thus, the term "load path" may refer to the drain-source path of a MOSFET as well as the collector-emitter path of a bipolar junction transistor (BJT). Inrush current control system 100 may be used, for example, in the power supply path of a component or peripheral used in a hot-swappable system. During operation, input port VIN may be connected to a DC power supply of a server system in order to provide power to load 108, which is representative of circuitry within a particular component or peripheral. When the system is first plugged in, conventional hot-swap controller IC 104 limits the gate voltage of transistor 106 to prevent high inrush currents while load capacitance $C_{Load}$ is being charged. In many conventional systems the gate voltage applied to transistor 106 during startup is determined in an open loop manner. For example, this gate voltage may be programmed into conventional hot-swap controller IC 104 or maybe a function of the hardware design of conventional hot-swap controller IC 104.

The ability to set the gate voltage of transistor 106 during startup is represented by external tuning block 102. External tuning block 102 may be implemented for example using nonvolatile memory, trimming devices or specified electronic components such as resistors, capacitors and other components that set the voltage of the gate of transistor 106 during startup. Conventional hot-swap controller integrated circuit 104 may monitor the current IDS that flows through transistor 106 and determine when load capacitance $C_{Load}$ is fully charged or almost fully charged based on IDS. When integrated circuit 104 determines that the startup phase is over, the gate voltage of transistor 106 is increased to a higher voltage for normal operation. This higher voltage decreases the on resistance of transistor 106 and allows for a low impedance path between input port VN and output port VOUT. Another way in which conventional hot-swap controller IC 104 may determine the end of the startup phase is by using a timer set the amount of time that Inrush current control system 100 stays in the startup phase.

Figure 1B:
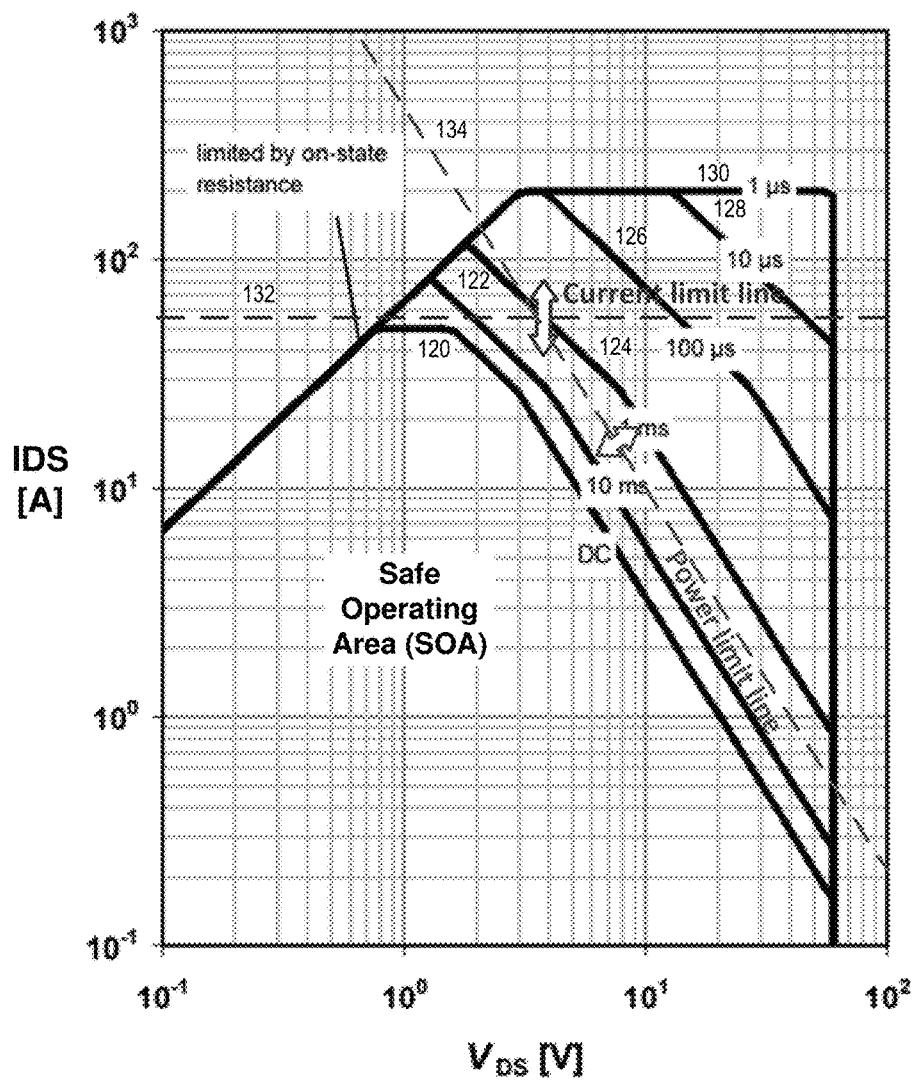

FIG. 1b illustrates a graph of drain current ID versus drain source voltage VDS that is used to illustrate the safe operating area of transistor 106. As shown, the safe operating area is bounded by a group of curves that represent maximum current points for a given drain source voltage and a given current duration. For example, curve 120, represents the maximum DC current for a given drain source voltage VDS. Curve 122 on the other hand, represents a maximum current for a duration of 10 ms given a particular drain source voltage VDS; curve 124 represents a maximum current for a duration of one millisecond given the particular drain source voltage VDS; curve 126 represents a maximum current for a duration of 100 μs given a particular drain source voltage VDS; curve 128 represents a maximum current for a duration of 10 μs is given a particular drain source voltage VDS; and curve 130 represents a maximum current for a duration of 1 μs given a particular drain voltage VDS. As can be seen by the curves in FIG. 1b as the duration of the current decreases the maximum amount of current increases. This is indicative of the thermal characteristics of transistor 106. For example, the longer the transistor 106 conducts a large current, the hotter transistor 106 will become. Eventually transistor 106 will hit a thermal limit when it continues to conduct a high current. Therefore transistor 106 is only able to maintain higher currents for short duration, which is represented by curves 122, 124, 126, 128 and 130. Curve 120, on the other hand, represents the maximum amount of DC current that transistor 106 can reliably and continuously conduct.

Curve 132 on the graph shown in FIG. 1b represents a current limit line that may be implemented, for example, by the inrush current limiting system 100 shown in FIG. 1a. By shifting current limit line 132 up and down along the y-axis, portions of the current limit line may be placed within the safe operating area of transistor 106. Thus, if inrush current limiting system relies on a current limit, there may be areas of operation that fall outside of the safe operating area. For example, the placement of current limit line 132 on the graph of FIG. 1b is placed at a higher current than all points of DC current limit curve 120. This means that the current limit line 132 is outside of the safe operating area for DC currents.

Power limit line 134 represents the application of a constant power limit. As can be seen by the graph of FIG. 1b, portions of the power limit line lie outside of the safe operating area for transistor 106. In addition, power limit line 134 lies outside of the safe operating area for all DC currents. This means that there may be some modes of operation in which it is possible to operate outside of the safe operating area for inrush current limiting systems that utilize the power limiting. Thus, the selection of current and power limits for inrush current limiting system 100 are chosen such that the likelihood of transistor 106 operating outside of the safe operating region is limited or reduced.

Figure 1C:
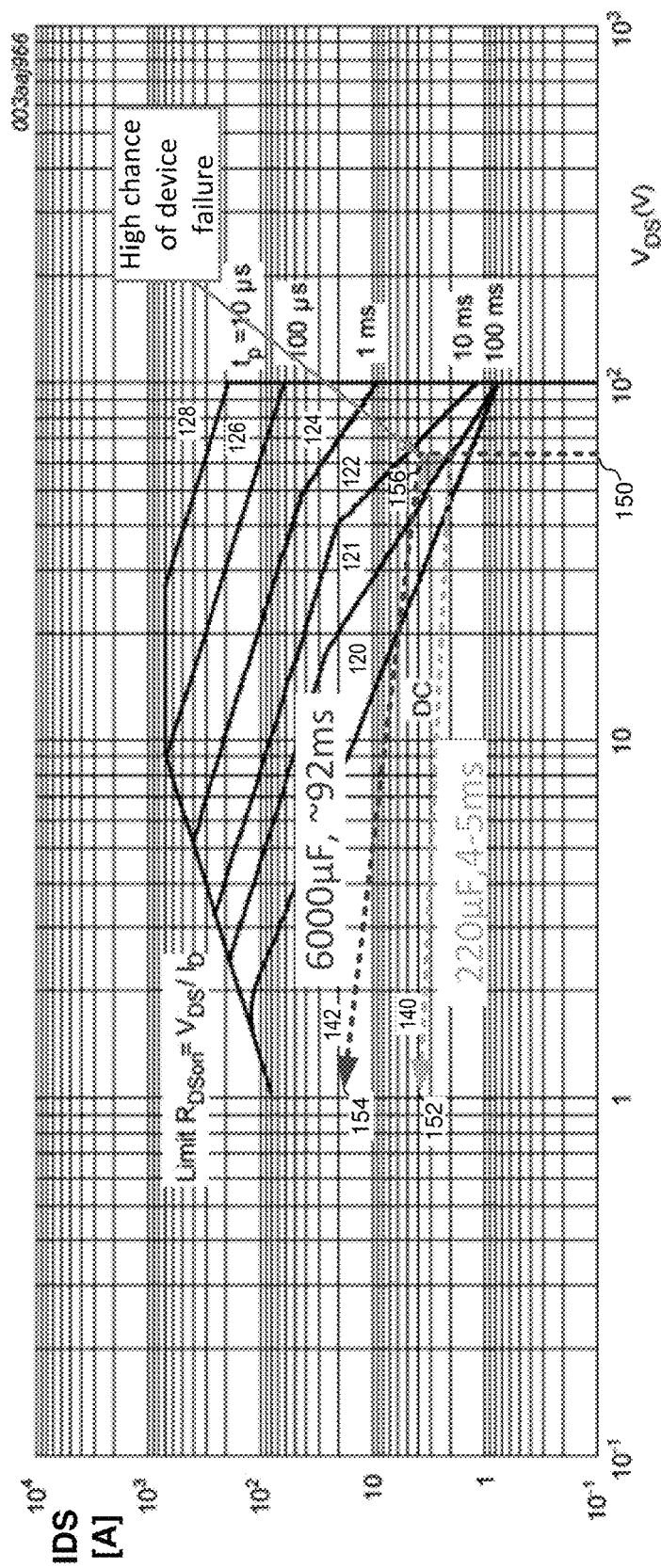

FIG. 1c illustrates two example current IDS versus voltage VDS trajectories 140 and 142 that may occur during the operation of inrush current control system 100. Also shown in the graph of FIG. 1c is a locus of current IDS versus voltage VDS curves 120, 121, 122, 124, 126 and 128 of transistor 106 defining a safe operating area. Trajectory 140 represents the currents and voltages used to charge a 220 μF load capacitor. During operation. Trajectory 140 starts at point 150 that represents a low current and an initial drain source voltage VDS of about 62 V. When transistor 106 is turned on, the drain source current IDS increases to about 2 A prior to the drain source voltage VDS decreasing to about 1 V. As shown, the total amount of time that it takes for trajectory 140 to start at point 150 and ended point 152 is between about 4 ms and 5 ms. Since this trajectory stays within the 10 ms safe operating curve 121, transistor 106 is maintained in a state of safe operation.

On the other hand, when the load capacitance is increased from 220 μF to 6000 μF, the resulting trajectory 142 traverses outside the bounds of safe operation. As shown, when transistor 106 is turned on the drain source current IDS increases to about 3 A, the total amount of time that it takes for trajectory 142 to start from point 150 in end up at point 156 is about 92 ms. Since a portion of trajectory 142 has a current IDS and voltage VDS that lies within area 154 above the 10 ms safe operating curve, there is a possibility of device failure during operation. Such performance as illustrated with respect to trajectories 140 and 142 may occur in systems such as system 100 that rely only on current limiting and/or power limiting during an initial inrush current phase.

In various embodiments, current through transistor 106 is maintained within the safe operating area by measuring a voltage across transistor 106, determining a maximum safe operating current for the given measure voltage, and using a feedback loop to maintain the current through transistor 106 to be less than or equal to the determined maximum safe operating current. In some embodiments, the current through transistor 106 is maintained at the determined maximum safe operating current. In various embodiments, the maximum safe operating current curve may be selected from among the DC current curve or one of the various safe operating curves that are associated with the amount of time that the current remains active through transistor 106. In various embodiments, safe trajectories may be determined that provide safe operation and provide fast charge times. Trajectories may also be selected that provide a desired transient behavior. For example, currents and voltages may be further limited to be less than the maximum safe operating current. In order to prevent voltage or current overshoots during operation.

Figure 2A:
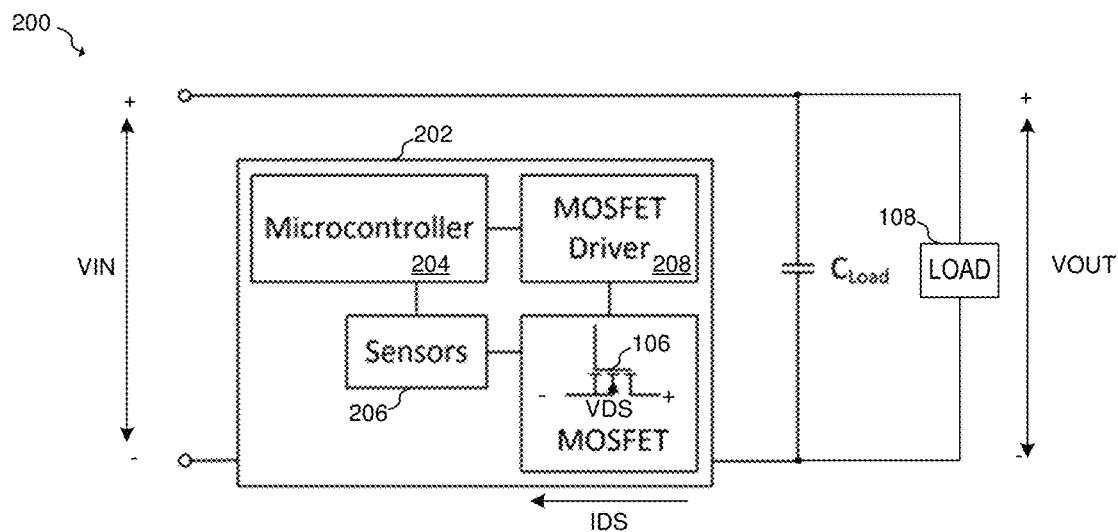
FIG. 2a illustrates an embodiment inrush control circuit.

FIG. 2a illustrates inrush current control circuit 200 according to an embodiment of the present invention. As shown, inrush current control circuit 200 may be coupled between the power source connected to input port VIN and load 108 connected to output port VOUT. Inrush current control circuit 200 includes circuit 202 that has microcontroller 204, MOSFET driver 208, transistor 106, and sensors 206. During operation sensors 206 monitor the voltage VDS across transistor 106 and the current IDS through transistor 106. Based on the measured voltage VDS through transistor 106, microcontroller 204 determines a safe operating current based on preprogrammed safe operating current curves, and determines an input signal from MOSFET driver 208. MOSFET driver 208 provides a control voltage for transistor 106 that forces current IDS through transistor 106 to be maintained at the determined maximum safe operating current. In alternative embodiments of the present invention, microcontroller 204 may determine the current that is less than the maximum safe operating current for transistor 106. While transistor 106 is shown as a MOSFET in FIG. 2A, any type of transistor may be used to implement transistor 106, including, but not limited to metal oxide semiconductor field effect transistors (MOSFETs), power MOSFETs, junction field effect transistor (JFETs) high electron mobility transistor (HEMT) such as gallium nitride (GaN) HEMTs and insulated gate bipolar transistors (IGBTs). The selection of which transistor to use may be made according to the specifications and voltage levels of the particular system.

Microcontroller 204 may be implemented, for example, using digital microcontroller circuits known in the art. Alternatively the function of microcontroller 204 may be implemented using custom digital logic, dedicated control logic, a digital signal processor, or other digital circuitry known in the art. Sensors 206 may include, for example, a current sensor for determining the current through transistor 106 for transistor, and a voltage sensor for determining the voltage VDS across transistor 106. Current sensors may include, for example, a resistor coupled in series with transistor 106 and a voltage measurement device used to measure the voltage across the series resistor. Accordingly, the current through transistor 106 is proportional to the voltage across the series resistor. In some embodiments, an analog-to-digital converter may be used to measure the voltage across the series resistor. The voltage across transistor 106 may be measured, for example, using a voltage measurement circuit and/or an analog-to-digital converter. MOSFET driver 208 may be implemented using transistor driver circuits known in the art that can apply a controlled voltage to a control node, such as a gate, of transistor 106.

Figure 2B:
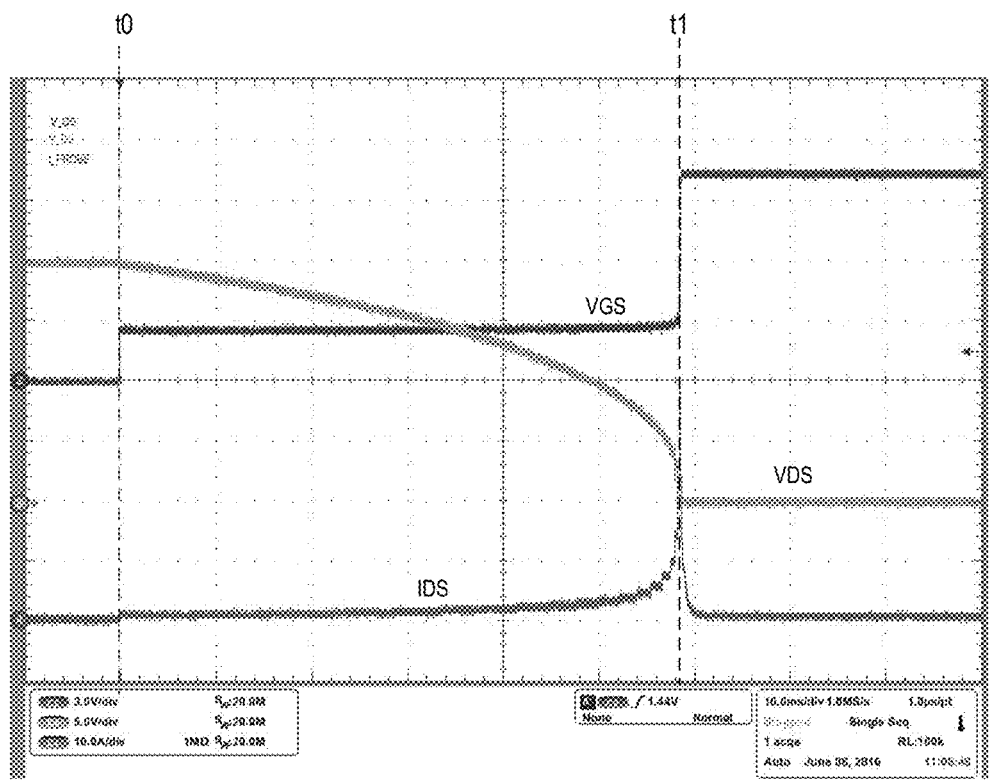

FIG. 2b illustrates a waveform diagram that illustrates the operation of inrush current control circuit 200 coupled to a load capacitor $C_{Load}$ having a capacitance of about 6600 μF. The transistor controlled by inrush current control circuit 200 is rated at 60 V and 50 A and has an on resistance of 8.1 mΩ. Waveform VGS represents the gate source voltage of transistor 106, waveform IDS represents the drain source current transistor 106, and waveform VDS represents the drain source voltage of transistor 106. Initially, the gate source voltage VGS of transistor 106 is set to 0 V, thereby turning off transistor 106 and the drain voltage VDS of transistor 106 is initially 20 V. At time to, inrush current control system 200 measures drain source voltage VDS, determines a corresponding maximum safe operating current, and provides a gate source voltage VGS that maintains the determined corresponding maximum safe operating current. As is shown in FIG. 2B, VGS increases to about 3 V as drain source voltage VDS decreases. As VDS decreases, inrush current control system 200 updates the determined maximum safe operating current and increases voltage VGS such that current IDS corresponds to the determined maximum safe operating current. Thus, as drain source voltage VDS decreases, gate source voltage VGS and drain source current IDS correspondingly increases.

At time t1, inrush current control system 200 determines that the initial charge up phase of the system is over, and at gate source voltage VGS of transistor 106 is increased to about 11 V in order to decrease the drain source resistance of transistor 106. As shown, the inrush period between times t0 and t1 takes about 60 ms. After time t1, the system to which inrush current control system 200 is connected may be operated in what may be called a normal operation mode. During this normal operation mode, inrush current control system 200 provides a low resistance connection between the load at port VOUT and the input power port VIN.

Figure 2C:
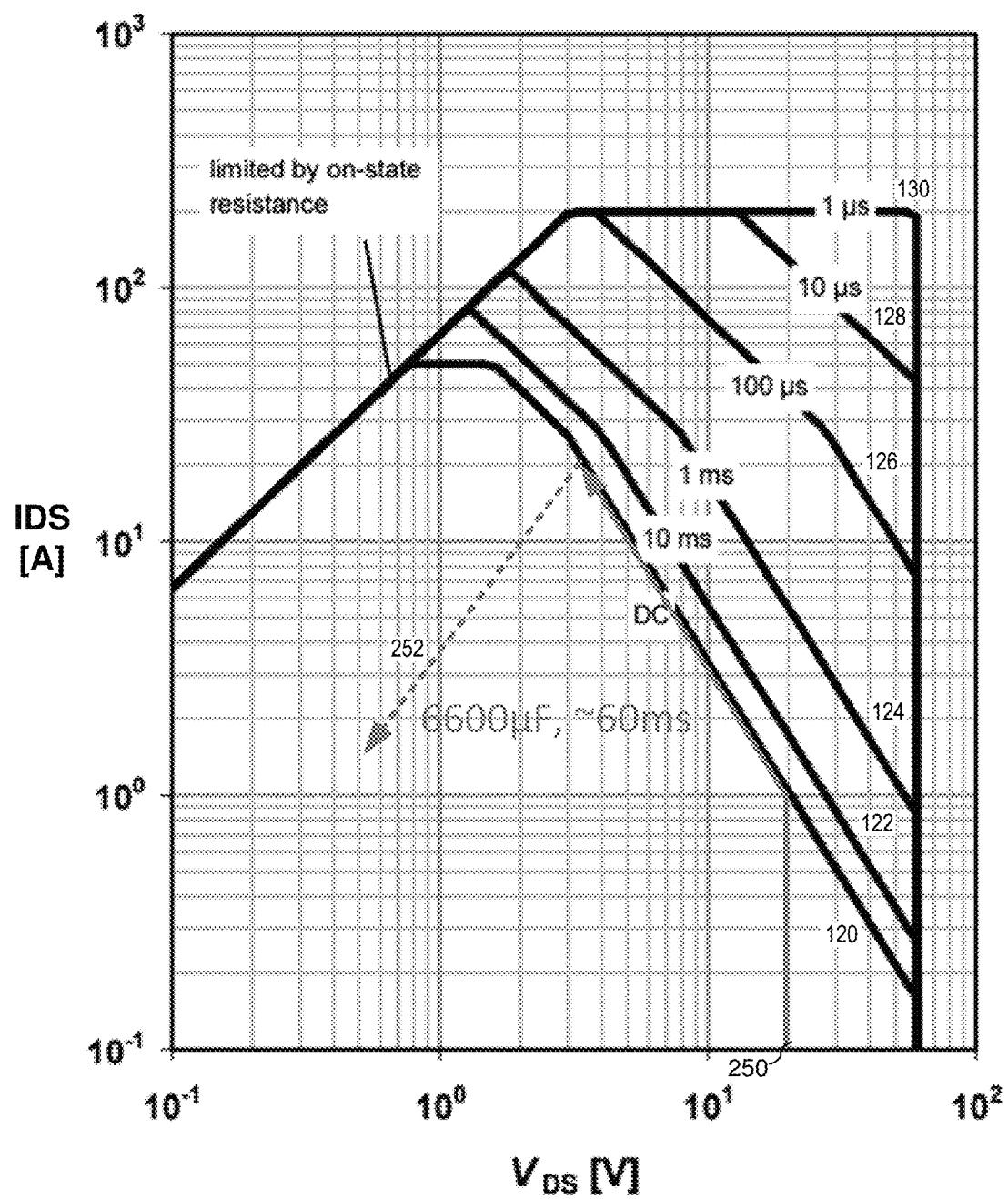

FIG. 2c illustrates a drain source current IDS versus drain source voltage VDS graph that shows trajectory 252 that corresponds to the waveform diagram of FIG. 2b. As shown, trajectory 252 starts at low current point 250 prior to inrush current control circuit 200 being turned on. When inrush current control circuit 200 is turned on, trajectory 252 moves to a point on maximum safe DC operating current line 120. As drain source voltage VDS across transistor 106 decreases, drain source current IDS increases along maximum safe DC operating current line 120. Trajectory 252 may follow the boundary of maximum safe DC operating current line 120 until and it reaches the thermal limit. However, as long as a heat sink is able to extract dissipated heat, the device may operate indefinitely and safely in some embodiments. If the thermal limit is reached due to unexpected reasons, inrush current control circuit 200 may switch off transistor for a set period in order for the temperature to return to a safe level.

In alternative embodiments, the trajectory of the current and voltage of transistor 106 may follow a boundary line different from DC line 120. For example, the trajectory may follow 10 ms boundary line 122, 1 ms boundary line 124, 100 μs boundary line 126, 10 μs boundary line 128, 1 μs boundary line 130 or a combination of boundary lines. By shifting the trajectory to one or more of these other boundary lines, more power can flow in a shorter time period in order to accommodate shorter inrush current times. In some embodiments, the trajectory of the current and voltage of transistor 106 follows a non-DC boundary line for a set time period that is within the pulse time associated with the particular non-DC boundary line. If load capacitance $C_{Load}$ is not fully charged within this time period, transistor 106 is turned off for a set time period in order to allow the temperature of transistor 106 to decrease to a safe level. Next, transistor 106 is turned on again and the trajectory of the current and voltage of transistor 106 again follows a non-DC boundary line for a set time period. The current through transistor 106 is turned on and off in this manner until load capacitance $C_{Load}$ is fully charged. The total time to fully charge $C_{Load}$ may or may not take longer than the DC line control method described above.

Figure 3:
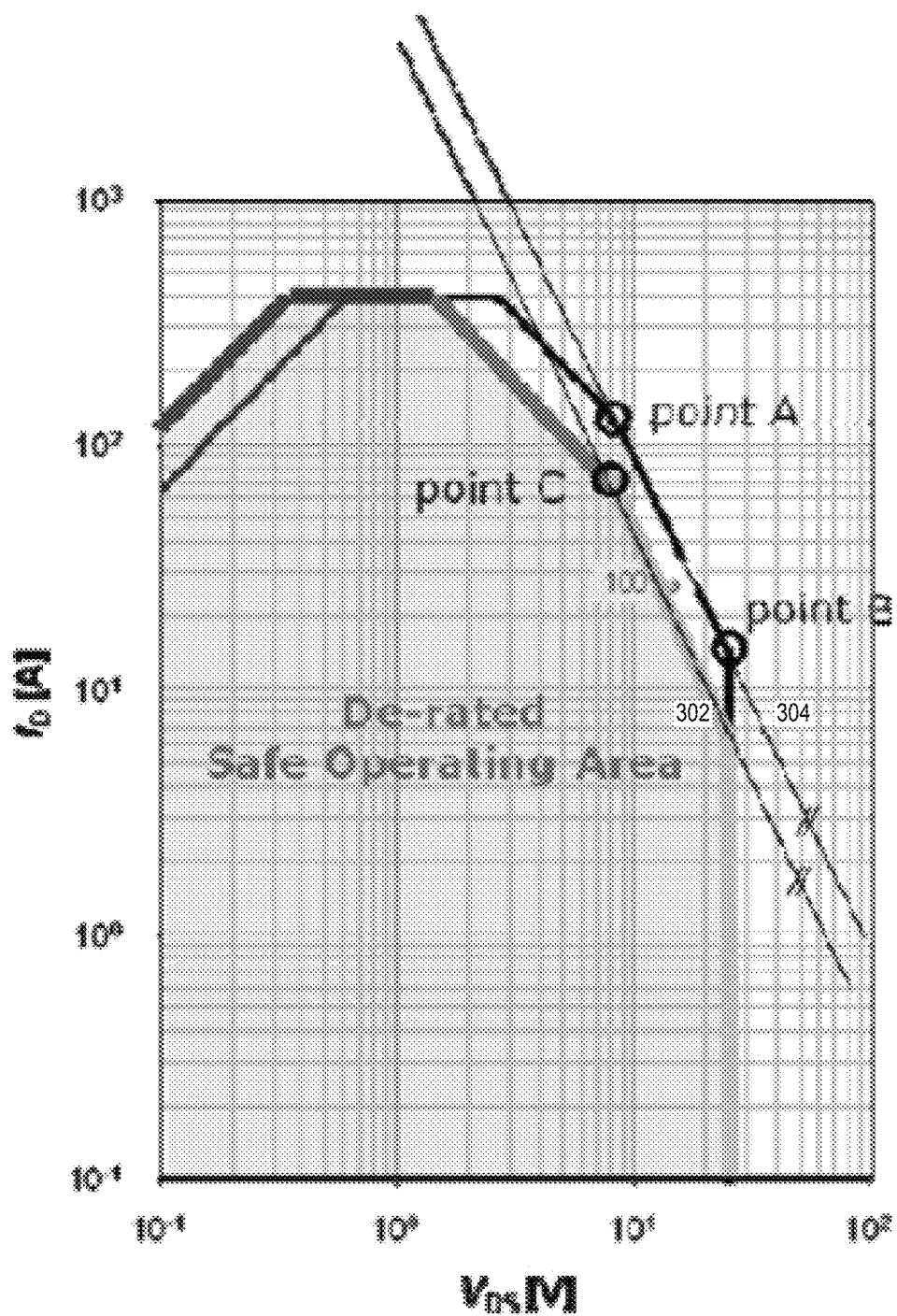
FIG. 3 illustrates a safe operating area chart that shows how safe operating boundaries are de-rated for temperature.

In some embodiments of the present invention, the safe operating area may be derated according to various environmental and operating conditions, such as temperature. For example, a safe operating current corresponding to a reference temperature of 25 C would be derated or decreased as a measured temperature increases. For example, FIG. 3 illustrates an initial safe operating area that has a boundary curve 404 that includes points A and B. Under some operating conditions, such as an elevated temperature, the right-hand boundary of the safe operating area shifts left from boundary 304 to boundary 302, thereby forming a derated safe operating area. New safe operating area boundary 302 includes point C. In various embodiments, the safe operating area may be derated using a number of different techniques. For example, a maximum safe operating current may be derated by multiplying the calculated maximum operating current with an environmental parameter related scale factor. In one example, the temperature of transistor 106 is monitored using a temperature sensor. Based on the output of the temperature sensor, microcontroller 204 shown in FIG. 2A may apply a scale factor. Alternatively, a constant current may be subtracted from the safe operating current. Based on the output of the temperature sensor or other environmental sensor.

Figure 4:
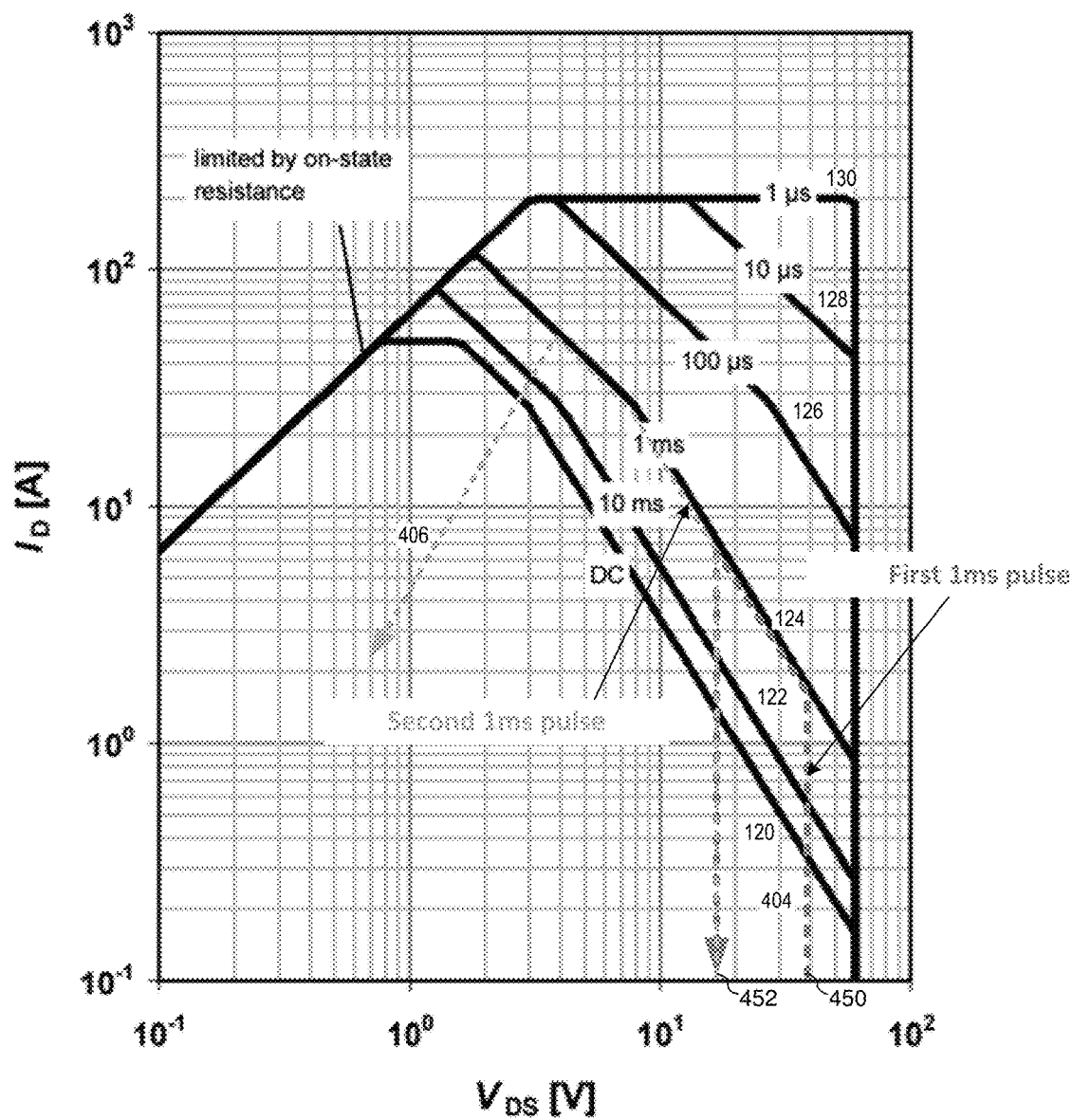
FIG. 4 illustrates a safe operating area chart that shows the operation of an embodiment inrush control circuit.

FIG. 4 illustrates a graph showing trajectories 404 and 406 of two 1 ms pulses according to an embodiment of the present invention. Trajectory 404 represents a first one millisecond pulse during which transistor 106 is turned on such that the current flowing through transistor 106 follows the one millisecond boundary curve 124. In some embodiments, the one millisecond pulse line is de-rated prior to the actual first pulse depending on the duty of the pulse. This can be calculated from the transient thermal impedance that may be found, for example, in a datasheet for transistor 106. Prior to transistor 106 being turned on for the first time, the current through transistor 106 is very low, and the drain source voltage VDS across transistor 106 is about 40 V at point 450. When transistor 106 is turned on, the drain source current IDS through transistor 106 increases until it reaches boundary line 124 on trajectory 304. During operation, current IDS increases as drain source voltage VDS decreases from about 40 V to about 18 V. After 1 ms has elapsed, transistor 106 is turned off to allow the device to cool. At this point 452, the current IDS through transistor 106 is very low and the drain source voltage VDS across transistor 106 is about 18 V. The time during which transistor 106 is turned off may be determined by monitoring the temperature of transistor 106 and waiting until the temperature of transistor 106 decreases below a predetermined threshold. Alternatively, transistor 106 is shut off during the first 1 ms pulse for a predetermined period of time. In some examples, this predetermined period of time may be on the order of 5 ms to 15 ms. Alternatively, other time periods may be used. These other time periods may have an effect on the derating of the 1 ms pulse line.

After transistor 106 has an opportunity to cool off, transistor 106 is turned on again and the current IDS through transistor 106 is controlled such that IDS continues to follow trajectories 406 via the 1 ms boundary line 124. If load capacitor $C_{Load}$ is fully charged during the second 1 ms pulse, transistor 106 may then supply power load 108 during a normal operation mode.

Another way in which the safe operating current may be derated is by shifting the safe operating curve itself. This safe operating curve may be shifted using mathematical techniques known in the art. In embodiments that determine safe operating team boundaries using a lookup table, additional lookup table entries may be entered according to temperature and/or other environmental parameters. In addition, methods of derating a safe operating area may be used as discussed in Infineon Application note—"Linear Mode Operation and Safe Operating Diagram of Power MOSFETs", by J. Schoiswhol, June 2010, which is incorporated by reference herein.

While embodiment inrush current control circuits may be used to control inrush currents for hot swap applications, embodiment inrush control circuits and methods may be used to operate a solid state circuit breaker, as well as a current limiting circuit that operates during nominal system operation. For example, an embodiment inrush current control circuit may be configured to detect whether there is a sudden in-rush current and whether it will cause the device to operate outside of its safe operating areas. The embodiment inrush current controller can then actively limit the current in real time to sustain operation without completely switching off the device or destroying it.

Figure 5A:
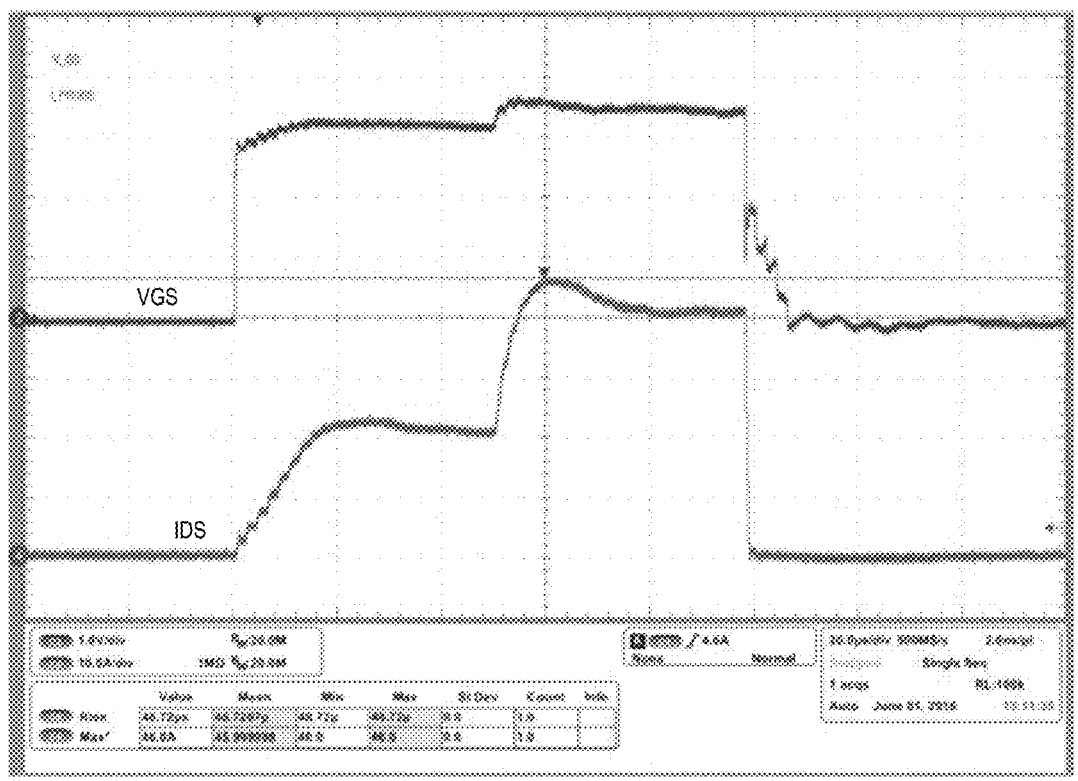
FIGS. 5a and 5b illustrate waveform diagrams that illustrate how embodiment inrush controllers may be used to produce controlled transient currents.
Figure 5B:
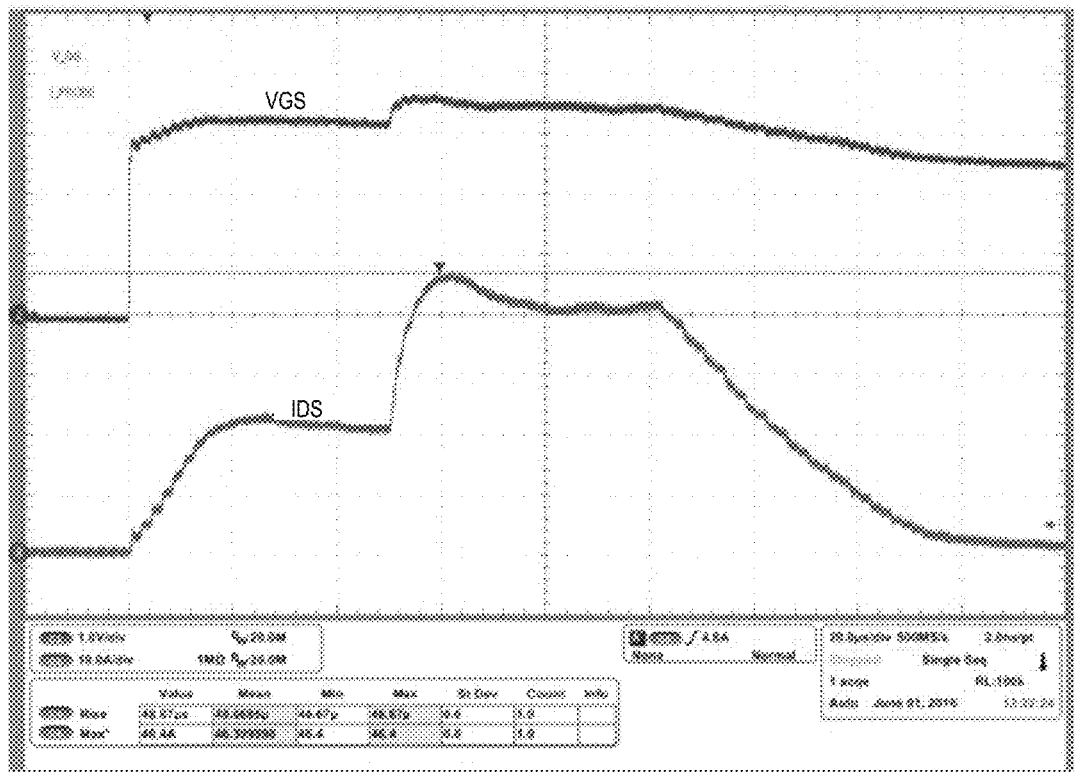

Although embodiment examples described herein are mainly directed toward maintaining current operation within the boundaries of the safe operating area, embodiment inrush current control circuits and methods may also be directed toward other applications that provide current shaping unrelated to safe operating boundaries. FIGS. 5a and 5b illustrate waveform diagrams showing gate source voltage VGS and drain source current IDS of transistor 106 according to embodiments of the present invention. As shown in FIG. 5a, gate source voltage VGS is provided such that drain source current IDS reaches a first local maximum at time t1, a second local maximum at time t2 and an abrupt decrease at time t3. On the other hand, FIG. 5b illustrates a waveform diagram in which gate source voltage VGS is provided such that drain source current IDS reaches a first local maximum at time t1, a second local maximum at time t2 and begins linear decrease until time t3. Each of the currents IDS shown in FIGS. 5a and 5b are controlled using embodiment current feedback control. Thus, drain source current IDS may be controlled in an arbitrary fashion. Such an ability to arbitrarily shaped drain source current IDS may be used in a number of different applications. For example, embodiment inrush current controllers may be configured to test the inrush current ability of various electronic equipment by essentially emulating various inrush current scenarios.

Figure 6A:
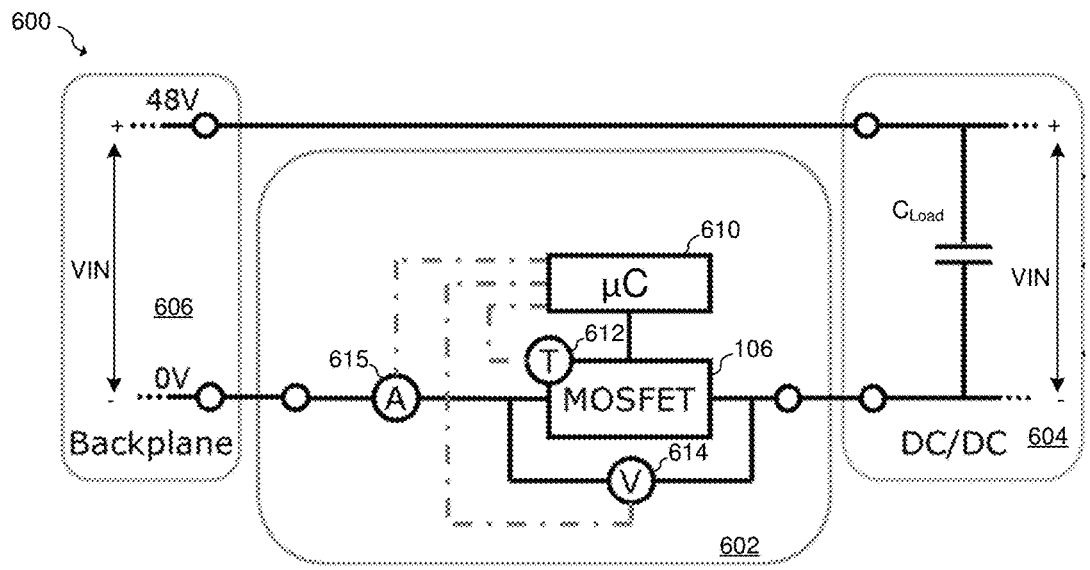
FIG. 6a illustrates a block diagram of an embodiment inrush current controller.
Figure 6B:
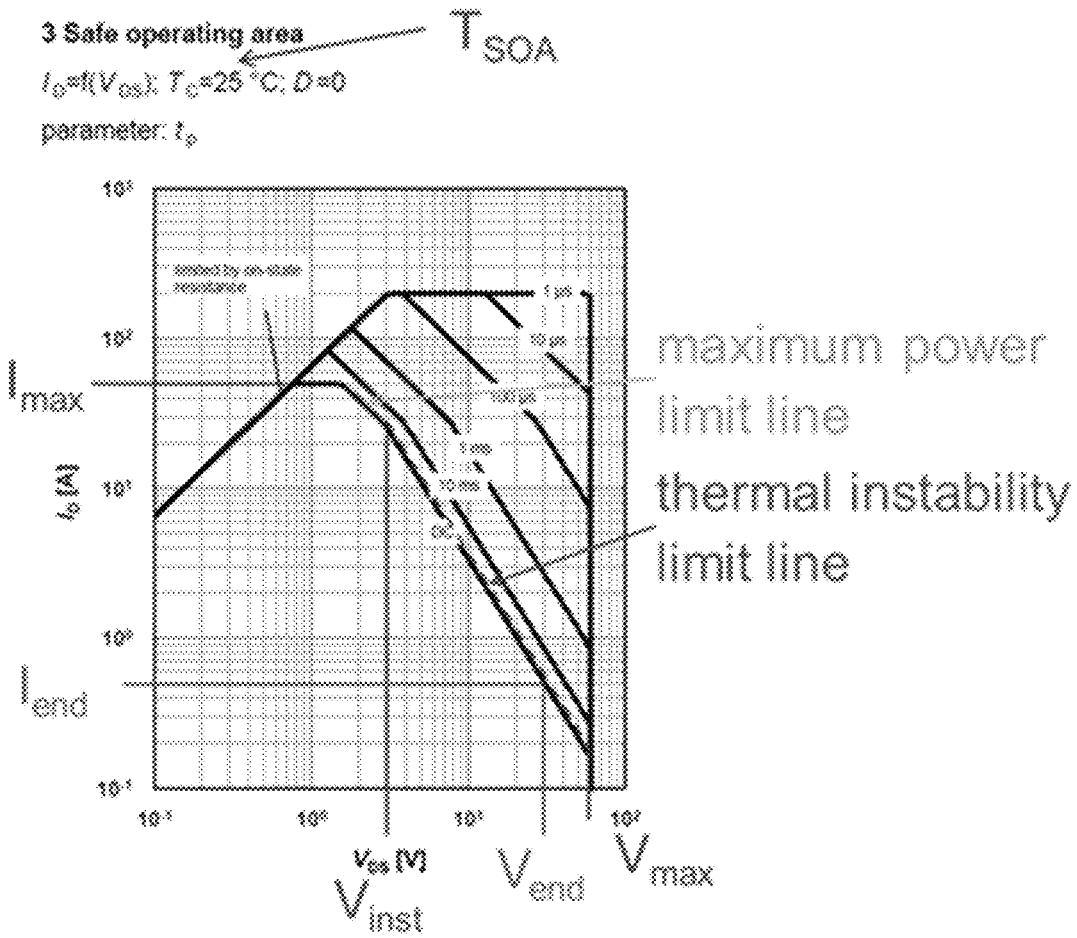
FIG. 6b illustrates an accompanying safe operating area graph.

FIG. 6a illustrates an embodiment power system 600 that includes backplane 606, embodiment inrush current controller 602 and load stage 604. As shown, backplane 606 provides a DC voltage of 48 V, and load stage 604 has a capacitance of $C_{Load}$. Inrush current controller includes transistor 106 that is controlled by microcontroller 610. Current sensor 615 measures the current that flows through transistor 106, voltage sensor 614 measures the voltage across transistor 106, and temperature sensor 612 measures the temperature of transistor 106. In various embodiments, microcontroller 610 determines a maximum safe operating current and provides a gate voltage that produces that current to transistor 106. During operation, the various components of inrush current controller 602 form a feedback loop that is used to control the current that flows through transistor 106.

In an embodiment, microcontroller 610 may calculate a target current Iref according to a measured voltage and temperature. One non-limiting example of a calculation that may be used to calculate target current Iref is as follows:

$$I_{ref} = 10^{-k1 \cdot log_{10} V + k2 + k3 * log_{10} \frac{T_J - T_C}{k4}},$$

where V is the measured voltage across transistor 106, $T_J$ is a measured junction temperature of transistor 106 and $T_C$ is a reference temperature constant. Constants k1, k2, k3 and k4 may be predetermined to provide a curve indicative of the safe operating area of transistor 106.

In some embodiments, safe operating area information is pre-stored in a data array or in equation form in the memory of the microcontroller 610 so that the specific values are looked-up during each control step. In one embodiment, current control method, the following data is used:

Data Sheet Parameters:
Tmax—maximum operating temperature.
RthJC—Thermal resistance from junction to case.
Safe Operating Area Diagram parameters:
$T_{SOA}$—Temperature of device represented in SOA diagram.
Vinst—voltage at which the DC thermal instability limit line starts.
Vend, Tend—One point chosen on the thermal instability limit line.
Imax—maximum current.
Vmax—maximum voltage.
Maximum transient thermal impedance diagram parameters:
ZthJC . . . thermal impedance to choose which pulse will be chosen (for DC-line: ZthJC=RthJC).

In various embodiments, the data sheet parameters Tmax and RthJC and maximum transient thermal impedance diagram parameter ZthJC may be found, for example in a datasheet that describes the characteristics of transistor 106.

In an embodiment, target current Iref, parameters $I_{inst}$, α, $V_{inst,2}$ and $β_2$ may be calculated as follows:

$$I_{inst} = \frac{T_{max} - T_{SOA}}{R_{thJC} \cdot V_{inst}}$$

$$α = \frac{\log_{10}\left(\frac{I_{inst}}{I_{end}}\right)}{\log_{10}\left(\frac{V_{inst}}{V_{end}}\right)}$$

$$V_{inst,2} = \frac{T_{max} - \text{Temperature}}{Z_{thJC} \cdot I_{inst}}$$

$$β_2 = \log_{10}(I_{inst}) - α \cdot \log_{10}(V_{inst,2}).$$

Current $I_{ref}$ can be represented in an array, where i represents voltage steps. In one embodiment, i represents voltage steps of 1V, however, in alternative embodiments, i may represent different voltage steps:

$$I_{refarray}[i] = 10^{α \cdot \log 10(i) + β_2}.$$

For the maximum power limit line, $$I_{ref} = \frac{T_{max} - \text{Temperature}}{V_{DS} \cdot Z_{thJC}}.$$

Microcontroller 610 may compare the measured current value with the $I_{ref}$ and adjust the gate VGS voltage using a fast feedback loop. In some embodiments, the feedback control loop may incorporate a dynamic controller such as a proportional-integral (PI) controller, which may be implemented digitally by microcontroller 610.

Figure 7A:
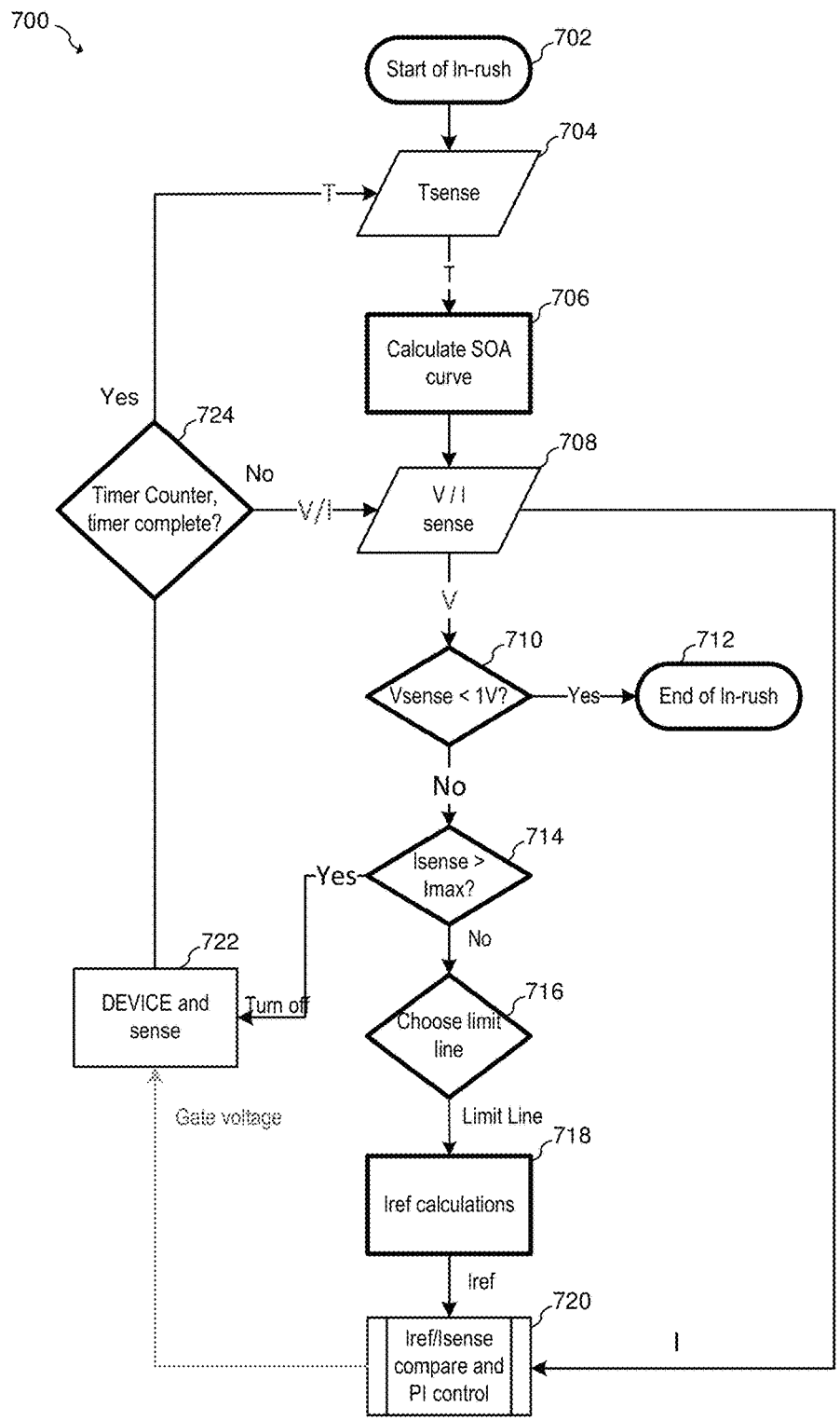
FIG. 7a illustrates a block diagram of an embodiment method of controlling inrush current.

FIG. 7a illustrates a block diagram of an embodiment method 700 that may be applied to embodiment inrush controllers. Method 700 starts at step 702, which corresponds to the start of an inrush current that may occur, for example, when a hot-swappable device is plugged into a live power supply. Once the controller determines that the inrush current is about to begin, the temperature of transistor 106 is determined in step 704. In various embodiments, the temperature of transistor 106 may be sensed using one or more temperature sensors known in the art. Next, in step 706 a safe operating area curve or a family of safe operating curves is calculated based on the measured temperature. These calculated curves are used to determine the current and voltage trajectory during the charging of the load capacitance in the following steps.

In step 708, the current through transistor 106 and the voltage across transistor 106 is sensed using a current sensing device and a voltage sensing device, respectively. Next in step 710, the sensed voltage is compared with the threshold of about 1 V. If the sensed voltage is less than this threshold, inrush current control system 200 makes a determination that the inrush phase is complete, and operation progresses to step 712 that signifies the end of the inrush stage. At this point the device may operate in a normal operation mode and the gate voltage of transistor 106 is increased to a higher value in order to significantly reduce the series does the series assistance of the device. It should be appreciated that in alternative embodiments, other thresholds besides 1 V may be used depending on the details of the particular system and its specifications.

If the sensed voltage is greater than the threshold voltage of 1 V, the sensed current Isense is compared with a maximum current value Imax in step 714. This maximum current value Imax may, for example, represent the highest amount of current that transistor 106 may tolerate, or may represent a value that is less than the highest amount of current that transistor 106 may tolerate to provide some margin to the system. This maximum current level Imax may be determined according to the specifications of transistor 106. If the sensed current Isense is greater than the maximum current Imax, transistor 106 is shut off in step 722. The method then proceeds to a timer counter in step 724. If the timer count is complete, the method proceeds to temperature sensing step 704 described above, otherwise the method proceeds to current and voltage sensing step 708.

If the measured current is less than maximum current Imax, a limit line within the safe operation area is selected in step 716. In various embodiments this limit line may be the DC current boundary or may be another curve associated with various pulse lengths as described hereinabove. In some embodiments, the determination of which limit line is selected may depend, in part, on the type of current trajectory being used. For example, in embodiments in which transistor 106 is activated for 1 ms pulses, the 1 ms limit line or boundary may be selected.

Current Iref is calculated in step 718. Iref may be calculated, for example, using systems, methods and algorithms described hereinabove. The calculated reference current Iref is applied to a dynamic controller such as a PI controller in step 720. In some embodiments measured current is subtracted from current Iref and to form an error signal. This error signal is then passed through the dynamic controller in order to produce the gate voltage. Once the gate voltages produced it is applied to the gate or control node of transistor 106 in step 722 and operation proceeds to either step 704 or step 708. It should be appreciated that the sequencing of the various steps in method 700 may be performed using a digital controller, such as microcontroller 610 in FIG. 6a, microcontroller 204 in FIG. 2a, or other microcontroller or digital control circuit disclosed in other embodiments herein. In some embodiments, method 700 is executed every 1 to 10 μs. Alternatively, other execution intervals may be used. It should be further appreciated that method 700 is just one specific example of many possible embodiment control methods. For example, in alternative embodiments, the sequence of the various steps in method 700 may be modified or adjusted, and/or additional steps related to trajectory selection may be added.

Figure 7B:
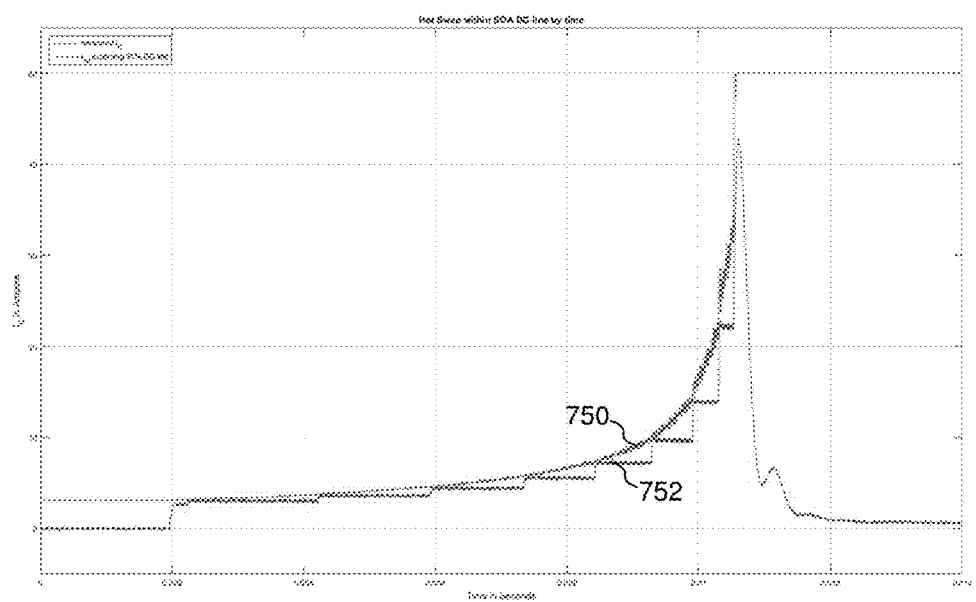
Figure 7C:
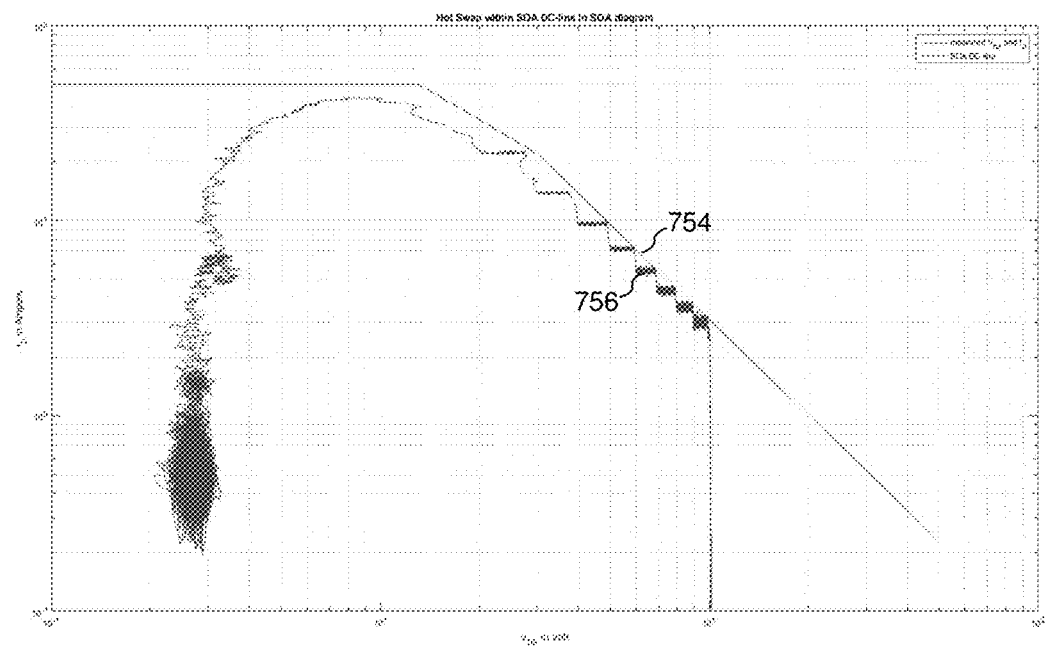

FIGS. 7b and 7c illustrate waveform diagrams that show a comparison between calculated Iref and Isense generated by method 700 described above. As shown in FIG. 7b, curve 750 represents calculated Iref with respect to time and curve 752 represents Isense generated by method 700 with respect to time. In FIG. 7c, curve 754 represents calculated SOA curve of Iref with respect to drain source voltage VDS of transistor 106 and curve 756 represents the measured Isense generated by method 700 with respect to drain source voltage VDS of transistor 106.

Figure 8A:
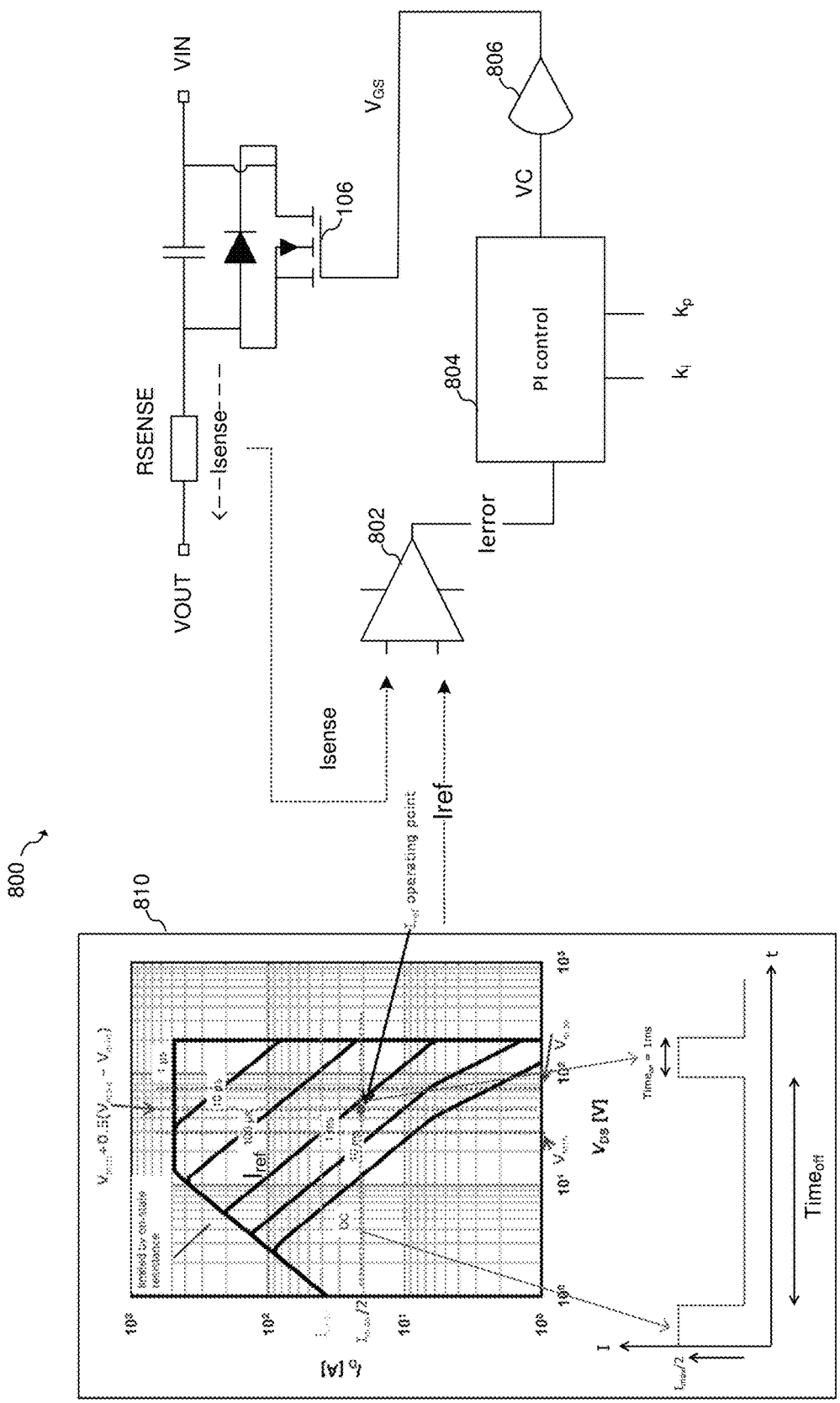
FIG. 8a illustrates an embodiment control loop and system for calibrating a dynamic controller.

FIG. 8a illustrates control diagram 800, according to an embodiment of the present invention. As shown, transistor 106 is connected between input port VIN and output port VOUT. A current sensor represented by resistor RSENSE is used to sense a current flowing through transistor 106. Error amplifier 802 subtracts the current measurement of Isense from a value representing reference current Iref calculated by safe operating area calculation block 810. The output of error amplifier 802 is error signal Ierror. Dynamic controller 804, which is implemented in FIG. 8a as a PI controller, produces a gate voltage control value VC for transistor 106 according to integral gain $k_i$ and proportional gain $k_p$. Gate driver 806 buffers and/or amplifies control value VC to produce gate control voltage $V_{GS}$. For the purpose of illustration, safe operating area calculation block 810 graphically represents the functionality of the calculation of reference current value Iref using a series of safe operating area curves.

In order to increase the accuracy of the inrush current controller, dynamic controller 804 may be tuned to the specific type (e.g. a MOSFET) of transistor 106 being used. In various embodiments, dynamic controller 804 is tuned automatically prior to operation of the inrush current controller. Thus, even if various transistor devices 106 vary within the same batch, an automatic tuning process may be used to take into account such variation. In embodiments in which dynamic controller 804 is implemented as a PI controller, integral gain $k_i$ and proportional gain $k_p$ may be tuned in accordance with the dynamic behavior of transistor 106.

During tuning, initial values for integral gain $k_i$ and proportional gain $k_p$ are provided to dynamic controller 804 and a current reference waveform Iref is generated by safe operating area calibration block 810. Error amplifier 802 compares the measured current Isense with current reference waveform Iref to produce error signal Ierror. If signal Ierror is less than a predetermined percentage of the initial Ierror within a predetermined number of cycles, the values for integral gain $k_i$ and proportional gain $k_p$ are saved, for example, in a memory. However, if signal Ierror is more than a predetermined percentage of the initial Ierror within a predetermined number of cycles, values for integral gain $k_i$ and proportional gain $k_p$ are updated and a further determination is made as to whether signal Ierror is more than a predetermined percentage of the initial Ierror within a predetermined number of cycles. This cycle is repeated until the Ierror is less than the predetermined percentage within the predetermined number of cycles. In some embodiments, the values for integral gain $k_i$ and proportional gain $k_p$ may be updated using, for example, least mean squares algorithms, known in the art. Alternatively, other algorithms may be used. In one example embodiment, the predetermined percentage is 5% and the predetermined number of cycles is 10. Alternatively, other values may be used. It should be understood that the functionality of the control loop shown in FIG. 8a may be applied to all of the various embodiments disclosed herein.

In some embodiments, dynamic controller 804 is tuned by applying a testing voltage across transistor 106 that is selected to be between the maximum and minimum voltage seen in the applied application. In one example, the applied voltage is selected to be halfway between the minimum and maximum voltages: (Vmin+0.5(Vmax−Vmin)). For a testing current, Iref is selected to be about one-half the maximum expected peak current Imax. Alternatively, other values for the test voltage and test currents may be used. From the safe operating point diagram of the device represented within safe operating area calculation block 810, it can be seen that the selected point is disposed approximately 2-3 ms between the 1 ms and 10 ms lines. In the present example, the 1 ms to the right of the selected point is chosen, since this places the selected point within the safe operating area. It should be appreciated that this is just one particular example of many possible embodiments.

During tuning of dynamic controller 804, transistor 106 is turned on for 1 ms using a gate voltage that produces the test value Iref on the 1 ms line, which is applied using the control loop depicted in FIG. 8a. After transistor 106 is turned on for 1 ms, transistor 106 is turned off for a period of time that is 99 times longer than the turn-on period, or 99 ms. It should be appreciated that the off-time period of 99 times longer than the turn-on period is just one example of various off-time period that can be used during tuning. Other turn-off periods may be implemented and the corresponding derating of the SOA may be applied depending on the ZthJC values obtained from the decided pulse length from the datasheet of the transistor 106.

Figure 8B:
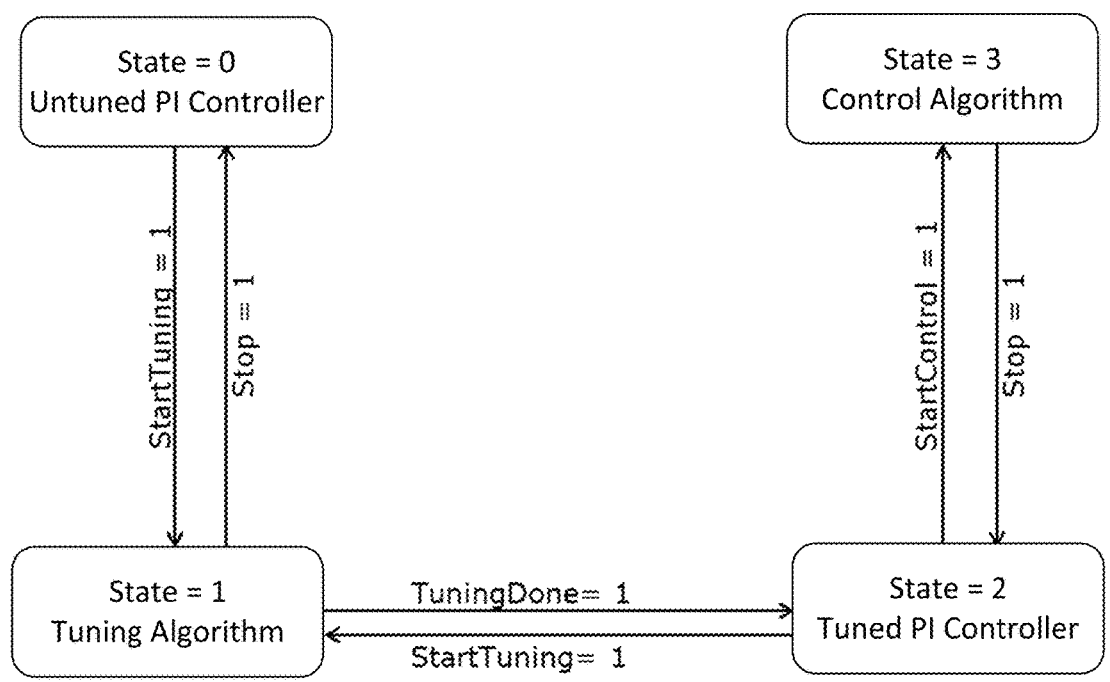
FIG. 8b illustrates an embodiment state machine for controlling the calibration of the dynamic controller.

FIG. 8b illustrates an embodiment state diagram of a state machine that may be used to facilitate the tuning of dynamic controller 804. State 0 represents the state in which dynamic controller 804 has an untuned PI controller. From state 0, the state machine transitions to state 1, during which the tuning algorithm is applied to dynamic controller 804. In one embodiment, this tuning algorithm is implemented according to the system and method of FIG. 8A; however, other tuning algorithms may be implemented. Next, in state 2, dynamic controller 804 is considered to be tuned, which makes the system available to implement embodiment inrush current control algorithms in state 3. If, during operation, a determination is made that dynamic controller 804 needs to be re-tuned, the state machine transitions back to state 0 via states 1 and 2. In various embodiments, the status of the state machine of FIG. 8b is tracked by the system to determine whether to initiate a tuning algorithm or whether to implement an embodiment control algorithm. It should be appreciated that the tuning algorithms described with respect to FIGS. 8a and 8b are examples of many embodiment tuning algorithms.

Figure 9A:
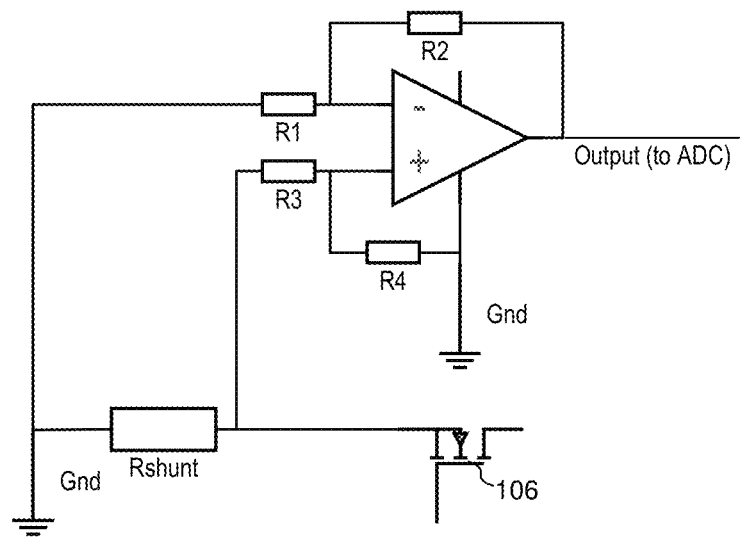
FIG. 9a illustrates an embodiment current measuring circuit.

FIG. 9a illustrates an example current measurement circuit 900 that may be used, for example, to measure the current through transistor 106. Current measurement circuit 900 includes resistor Rshunt that is configured to be coupled in series with transistor 106, as well as a feedback amplifier circuit that include resistors R1, R2, R3 and R4 and operational amplifier A1. As shown, resistor R1 is coupled between ground and the negative input terminal of operational amplifier A1; resistor R2 is coupled between the output terminal and the negative input terminal of operational amplifier A1; resistor R3 is coupled between resistor Rshunt and the positive input terminal of operational amplifier A1; and resistor R4 is coupled between the ground and the positive input terminal of operational amplifier A1. In some embodiments, the output of operational amplifier A1 is coupled to an analog-to-digital converter (not shown). During operation, amplifier circuit measures of voltage across shunt resistor Rshunt, which is proportional to the current that flows through transistor 106. The voltage at the output of operation amplifier A1 may be used by embodiment inrush current controllers to determine the current through transistor 106. In some embodiments, additional scaling circuitry may be coupled to the output terminal of operational amplifier A1.

In various embodiments, operational amplifier A1 may be a separate integrated circuit and resistors Rshunt, R1, R2, R3 and R4 may be implemented as discrete resistors disposed on a circuit board. Alternatively, the components of current measurement circuit 900 may be disposed on a single integrated circuit. It should be appreciated that current measurement circuit 900 shown in FIG. 9A is just one of many example circuits that may be used to measure the current through transistor 106. In alternative embodiments, other circuits including, but not limited to other amplifier topologies, Hall effect sensors, transformer type sensors and Rogowski coils may be used to measure the current through transistor 106.

Figure 9B:
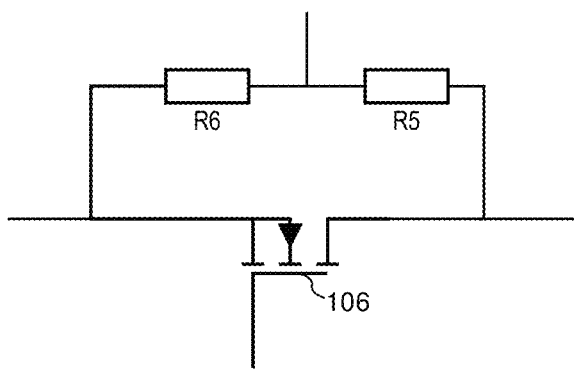
FIG. 9b illustrates an embodiment voltage measuring circuit.

FIG. 9b illustrates an embodiment voltage measurement circuit that may be used to measure the voltage VDS across transistor 106. As shown, a voltage divider including resistors R5 and R6 is coupled in parallel with transistor 106. The output of the voltage divider may be routed to the input of an analog-to-digital converter (not shown) or to other measurement circuit node. It should be understood that voltage measurement circuit 910 is just one of many different voltage measurement circuits that may be used to measure voltage across transistor 106.

Figure 10A:
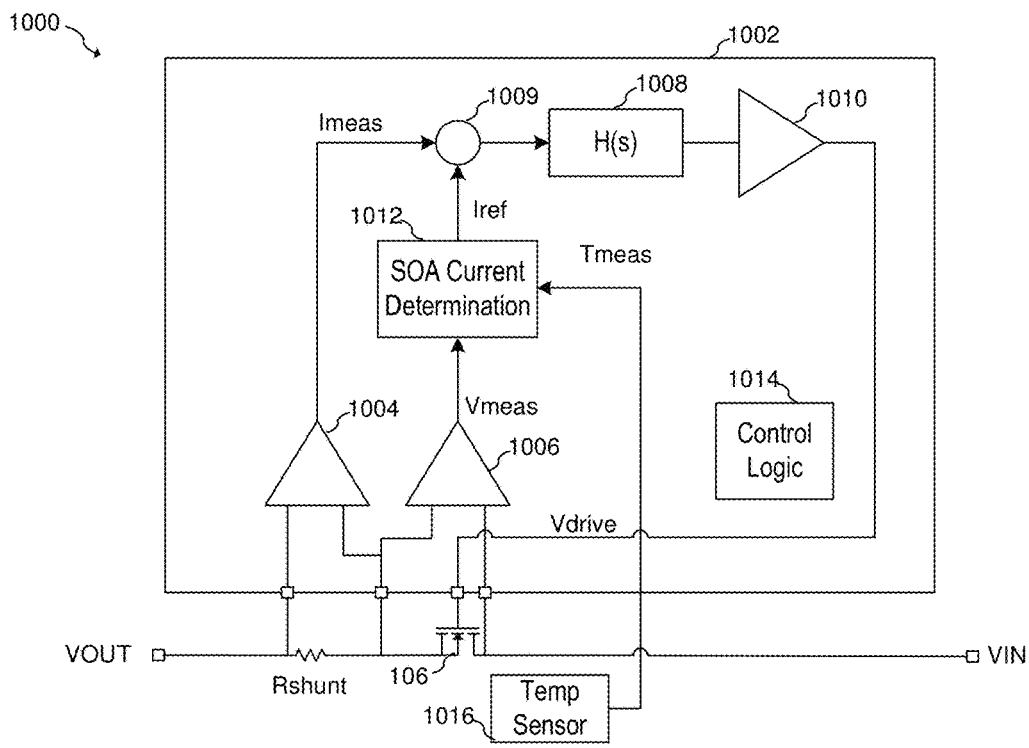
FIGS. 10a-10d illustrate block diagrams of embodiment inrush control systems.

FIGS. 10a-10d illustrate various embodiment implementations of inrush control systems. Turning to FIG. 10a, inrush system woo includes inrush controller 1002 coupled to transistor 106. Control circuit 1002 may be implemented, for example, on a single integrated circuit or may be implemented using multiple integrated circuits and/or various discrete components. In various embodiments, safe operating area current determination circuit 1012 calculates reference current Iref based on the output of temperature sensor 1016 and voltage measurement circuit 1006 as described with respect to various embodiments herein. Temperature sensor 1016 may be co-located with transistor 106 and/or thermally coupled to transistor 106 such that temperature sensor 1016 is able to provide a measurement or an estimate of the temperature of transistor 106 to safe operating area current determination circuit 1012. Voltage measurement circuit 1006 measures the voltage across transistor 106 and provides a voltage measurement signal Vmeas to safe operating area current determination circuit 1012 as well.

Current measurement circuit 1004 measures the voltage across resistor Rshunt coupled in series with transistor 106 and provides a current measurement signal Imeas to summing circuit 1009 that determines an arithmetic difference between current measurement signal Imeas and reference current Iref generated by safe operating area current determination circuit 1012. In various embodiments, reference current Iref may be determined based on the various safe operating area boundary curves as described in embodiments herein. Summing circuit 1009 may be implemented, for example, using an amplifier circuit and/or an error amplifier, the output of which is coupled to the input of dynamic controller 1008.

Dynamic controller 1008 implements a PI controller or other transfer function that may be used to compensate the current control loop. Gate driver 1010 has an input coupled to the output of dynamic controller 1008 and outputs the drive a gate drive signal to the gate terminal of transistor 106. In various embodiments, control logic 1014 is responsible for the state machines and other digital logic used to control controller 1002.

In various embodiments, current measurement circuit 1004, voltage measurement circuit 1006 and temperature measurement circuit 1006 may be implemented using analog circuits known in the art, and gate driver 1010 may be implemented using driving circuits known in the art. Safe operating area current determination circuit 1012, summing circuit 1009 and dynamic controller 1008 may be implemented in either the analog or digital domain depending on the particular system and its specifications.

Figure 10B:
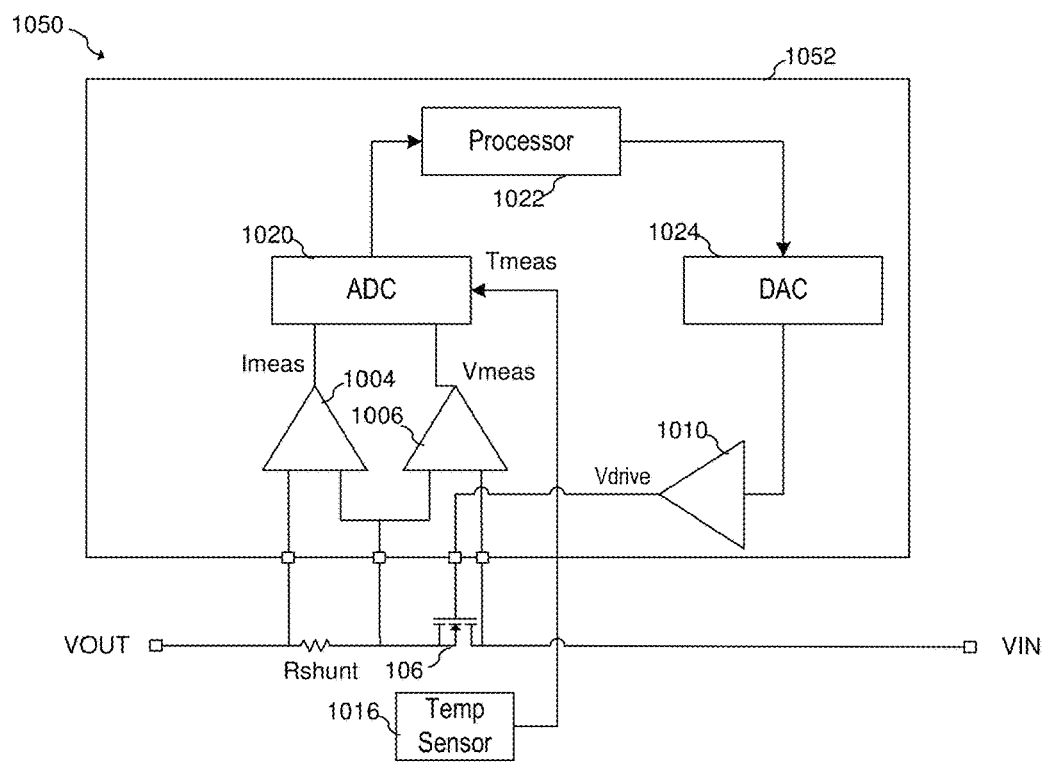

FIG. 10b illustrates a digital implementation of an embodiment inrush control circuit 1050. As shown, inrush control circuit 1052 includes current measurement circuit 1004, voltage measurement circuit 1006, and gate driver 1010. The functionality of safe operating current determination circuit summing circuit 1009 and dynamic controller 1008 is implemented within processor 1022. Analog-to-digital converter 1020 converts the output of current measurement circuit 1004, the output of voltage measurement circuit 1006 and the output of temperature sensor 1016 from the analog domain to the digital domain. Likewise, digital to analog converter 1024 converts the output of processor 1022 from the digital domain to the analog domain. In some embodiments, three separate analog-to-digital converters may be used to digitize the output of current measurement circuit 1004, voltage measurement circuit 1006 and temperature sensor 1016. Alternatively, a single multiplexed analog-to-digital converter may be used to implement analog-to-digital converter 1020. It should be appreciated that in both circuits of FIG. 10a and FIG. 10b, temperature sensor 1016, transistor 106 and shunt resistor may be disposed on a same integrated circuit as controller 1052 in alternative embodiments.

Figure 10C:
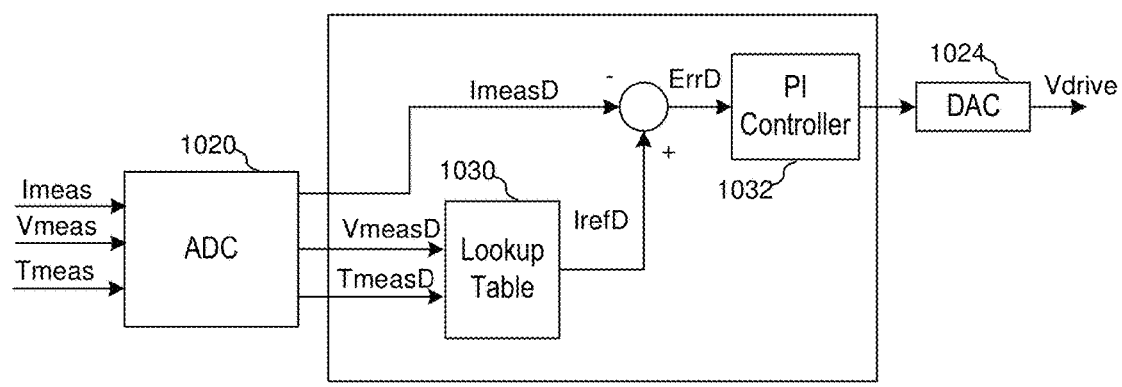

FIG. 10c illustrates a block diagram that shows some additional details of a digital implementation of an embodiment inrush control circuit that may be used to implement the inrush control circuit 1050 shown in FIG. 10b. As shown, safe operating area current determination function is implemented using a lookup table 1030 that produces a digital current reference value IrefD based on digitized voltage and temperature measurements VmeasD and TmeasD. From here, lookup table 1030 produces a digital current reference value IrefD, which is compared with the digitized current measurement value ImeasD to produce error signal ErrD. Error signal ErrD is connected to the input of PI controller 1032, the output of which is converted back into the digital domain using digital-to-analog converter 1024.

Figure 10D:
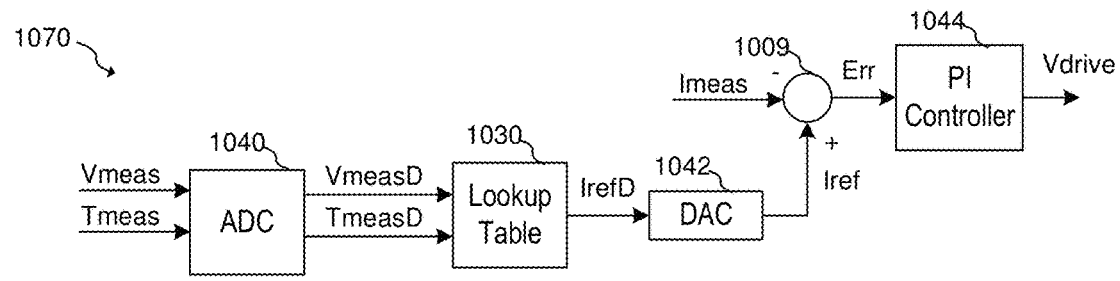

Turning to FIG. 10d, a portion 1070 an embodiment inrush current control system is shown that processes the measured current and the PI controller 1044 in the analog domain. As shown, analog-to-digital converter 1040 digitizes measured voltage Vmeas across transistor 106 and digitizes the temperature measurement Tmeas of transistor 106. The output of analog-to-digital converter 1040 provides digital representation of the measured voltage VmeasD and a digital representation of the temperature TmeasD. Analog-to-digital converter 1040 may be implemented as a single, multiplexed analog-to-digital converter or may be implemented using two parallel analog to digital converters.

Both VmeasD and TmeasD are provided to lookup table 1030, which produces digital reference current IrefD based on embodiment safe operating area current determination methods discussed herein. Digital reference current IrefD is converted from the digital domain using digital-to-analog converter 1042 to form reference current signal Iref, which is compared to the measured voltage of the loop using summing circuit 1009. Summing circuit 1009 produces error signal Err, and PI controller 1044 is used to determine the drive strength signal Vdrive for transistor 106 based on error signal Err.

Figure 11:
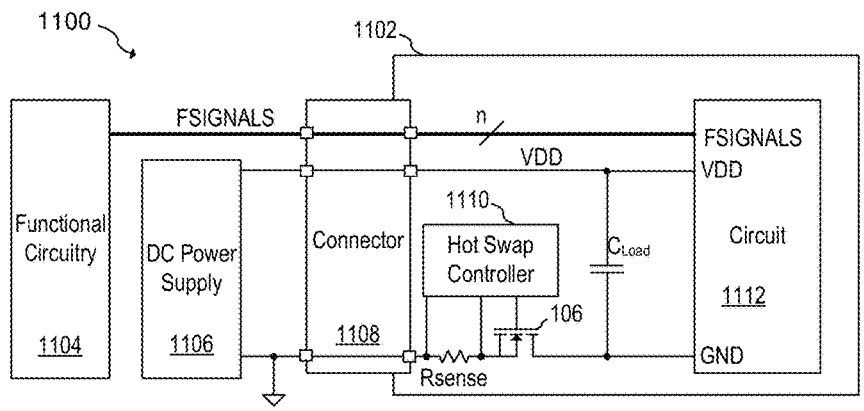
FIG. 11 illustrates an embodiment hot swappable system.

FIG. 11 illustrates a hot swappable circuit system 1100 utilizing an embodiment hot-swap controller 1110. As shown, hot swappable circuit system 1100 includes hot swappable circuit 1102 having connector 1108. Hot swappable circuit 1102 includes circuit 1112 that may be interfaced to external functional circuitry 1104 via signals lines FSIGNALS. In one embodiment, external functional circuitry 1104 may represent a computer server and circuit 1112 on hot swappable circuit 1102 may represent a computer peripheral used by the computer server. It should be understood, however, that external functional circuitry 1104 and circuit 1112 may represent any kind of circuitry that may be interfaced with each other.

When hot swappable circuit 1102 is plugged into a target system via connector 1108, circuit 1112 receives it power from DC power supply 1106 via VDD and GND. However, when hot swappable circuit 1102 is first connected to DC power supply 1106, embodiment hot swappable controller 1110 controls the inrush current through transistor 106 according to embodiment system and methods described herein such that transistor 106 operates within a safe operating area as capacitor $C_{Load}$ is being charged. It should be understood that any of the disclosed embodiments may be used to implement hot swap controller 1110.

In some embodiments, the change of voltage across transistor 106 is measured during inrush when charging an unknown capacitive load. By integrating the current over time and comparing this to the change in voltage, the size of the unknown capacitive load can be calculated according to $C=\Delta Q/\Delta V$ where $\Delta Q=I(load)*\Delta t$. The measurement may be started at the beginning of the charging cycle and can then be refined during the charging period. In some embodiments, knowledge of the capacitive load to be charged may be used to determine a thermal budget. This thermal budget may then be used in support of determining a trajectory. With the information of the load, an embodiment inrush controller can choose a current-voltage trajectory that charges the load in a shortest possible time without exceeding the thermal limits of transistor 106. Such trajectories may include, for example, utilizing the higher current safe operating area associated with transient pulses.

In some embodiments, an inrush controller may control the current such that it has a rectangular or pulsed current shape at the beginning of the charging cycle instead of a DC current in order to operate at higher current levels than would be allowed by the DC safe operating are boundary for a given measured voltage across transistor 106.

In various embodiments, target current Iref is decreased below the safe operating area boundary once the measured voltage across transistor 106 falls below a predetermined threshold. By doing this, a current overshoot may be attenuated or avoided immediately prior to the capacitive load being fully charged. By attenuating such a current overshoot, a voltage overshoot due to line inductances may also be mitigated and/or avoided. For example, in one embodiment, transistor 106 may conduct up to 50 A during an initial portion of an inrush phase. However, when the voltage across transistor 106 falls below a first threshold of about 3 V, the current through transistor 106 is limited to 20 A. Later on, when the voltage across transistor 106 falls further below a second threshold of about 0.5 V, the current through transistor is further reduced to 5 A. Such a reduction in current during the inrush phase serves to reduce or eliminate overshoot. Alternatively, the current overshoot may be mitigated or avoided using other current limits and voltage thresholds.

Embodiment inrush control devices may also be adapted to control the discharging of large capacitive loads as well as the charging of large capacitive loads. For example, in the case of a short circuit or a hot swap, embodiment inrush control circuits may be configured to ensure that a large capacitance is quickly discharged in a manner that maintains the series transistor in a safe operating area without exceeding its thermal limits. Also, embodiment inrush control devices may be applied to both high voltage and low voltage systems.

Figure 12:
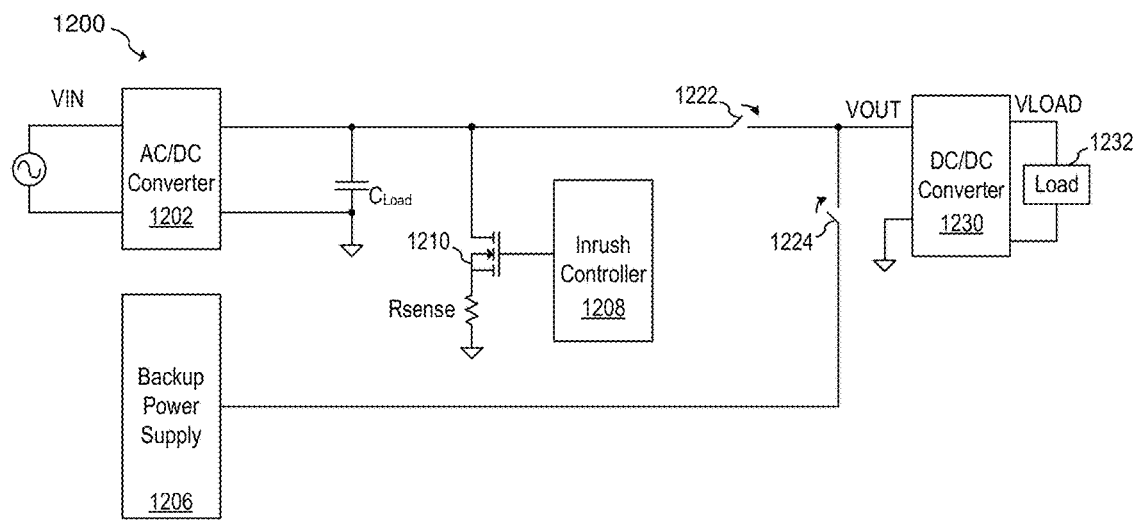
FIG. 12 illustrates an embodiment two-stage power supply system with backup power.

FIG. 12 illustrates an embodiment two-stage power supply system 1200 that includes a first stage AC/DC converter that converts an AC input voltage at node VIN to a first DC voltage at node VOUT, and a second stage DC/DC converter that converts the first DC voltage at node VOUT to a second DC voltage a node VLOAD coupled to load 1232. In one example embodiment, AC/DC converter 1202 converts a 230 V AC line voltage to a 48 V DC voltage, and DC/DC converter 1230 converts the 48 V DC voltage to 5 V, 12 V and/or 24 V. Alternatively, two-stage power supply system 1200 may perform a power conversion using other voltages. In some embodiments, AC/DC converter 1202 may also perform power factor correction.

During normal operation, switch 1222 is closed and switch 1224 is open such that power is transferred from AC/DC converter 1202 to DC/DC converter 1230. In the event of a failure of the AC/DC converter 1202, or in the event of a dropout or brownout of the AC power supplied to AC/DC converter 1202, switch 1222 is opened, switch 1224 is closed and backup power supply 1206 supplied power to DC/DC converter 1230. Backup power supply 1206, which provides interim power to DC/DC converter 1230, may include, for example, one or more batteries. In some embodiments, during times that backup power supply 1206 is not supplying power to DC/DC converter 1230, power may flow from AC/DC converter to backup power supply 1206 and/or power may flow from the load to backup power supply 1206 via DC/DC converter 1230 in order to recharge the batteries (or other charge storage devices) of backup power supply 1206.

In some embodiments in which the output voltage of backup power supply 1206 does not match the output voltage of AC/DC converter 1202, charge stored in capacitor $C_{Load}$ may be discharged via transistor 1210 and resistor Rsense until the voltage across capacitor $C_{Load}$ approximately matches the output voltage of backup power supply 1206. By using an embodiment inrush controller 1208, the current flowing through transistor 1210 may be controlled using embodiment systems and methods such that transistor 1210 stays within its safe operating area. Inrush controller 1208 may be implemented using any of the various inrush controller embodiments disclosed herein. In an embodiment, inrush controller turns-on transistor 1210 when two-stage power supply system 1200 detects a loss of AC input voltage and/or a brownout condition. Upon detection of this condition, inrush controller 1208 controls the current through transistor 1210 to stay within the safe operating area until the voltage across transistor 1210 and resistor Rsense is approximately equal to the output voltage of backup power supply 1206. In some embodiments, capacitor $C_{Load}$ may be discharged to different voltages or be completely discharged as well. By discharging capacitor $C_{Load}$, large current transients may be avoided when power sources are being switched.

According to some embodiments, the following examples are provided.

Example 1

A method of controlling current through a transistor that includes
  measuring a voltage across the transistor;
  measuring a current through the transistor;
  determining a safe operating current for the measured voltage across the transistor; and adjusting a voltage of a control node of the transistor using a feedback controller until the measured current through the transistor is not greater than the determined safe operating current.

Example 2

The method of example 1, wherein measuring the current through the transistor includes measuring a voltage across a resistor coupled in series with a load path of the transistor.

Example 3

The method of examples 1 or 2, wherein determining the safe operating current includes using a lookup table.

Example 4

The method of examples 1 or 2, wherein determining the safe operating current includes calculating the safe operating current according to a mathematical function.

Example 5

The method of example 3, wherein the lookup table includes entries of safe operating current with respect to a load path voltage for direct current conditions.

Example 6

The method of example 5, wherein the lookup table further includes entries of safe operating current with respect to the load path voltage for transient voltage conditions.

Example 7

The method of examples 1, 2, 3 or 4 further including pulsing the voltage of the control node, pulsing including:
  asserting the voltage of the control node for a first time period; and
  de-asserting the voltage of the control node for a second time period after the first time period, wherein de-asserting the voltage of the control node including providing a voltage to the control node that turns the transistor off.

Example 8

The method of example 7, wherein determining the safe operating current includes determining the safe operating current according to the first time period.

Example 9

The method of examples 1, 2, 3 or 4, wherein determining the safe operating current includes determining the safe operating current for a continuous current.

Example 10

The method of example 1, 2, 3 or 4, further including:
  calculating an estimated turn-on time; and
  determining the safe operating current according to the estimated turn-on time, wherein an instantaneous magnitude of the safe operating current according to the estimated turn-on time is greater than the safe operating current for a direct current.

Example 11

The method of examples 1, 2, 3, 4, 5, 6, 7, 8, 9 or 10 further including measuring a temperature of the transistor, wherein determining the safe operating current further includes determining the safe operating current based on the measured temperature.

Example 12

The method of example 11, wherein determining the safe operating current includes using a lookup table.

Example 13

The method of example 12, wherein the lookup table includes entries of safe operating current with respect to the measured voltage across the transistor and with respect to the measured temperature.

Example 14

The method of examples 1, 2, 3, 4, 5, 6, 7, 8, 9, 10, 11, 12, 13 or 14, further including:
comparing the measured voltage across the transistor to a first voltage threshold; and
when the voltage across the transistor is less than the first voltage threshold, adjusting the voltage of the control node of the transistor using the feedback controller until the measured current through the transistor is not greater than a first target current, the first target current being less than the determined safe operating current.

Example 15

The method of example 14, further including,
comparing the measured voltage across the transistor to a second voltage threshold less than the first voltage threshold; and
when the voltage across the transistor is less than the second voltage threshold, adjusting the voltage of the control node of the transistor using the feedback controller until the measured current through the transistor is not greater than a second target current, the first target current being less than the second target current.

Example 16

The method of examples 1, 2, 3, 4, 5, 6, 7, 8, 9, 10, 11, 12, 13, 14 or 15, further including charging a capacitor via the transistor.

Example 17

The method of examples 1, 2, 3, 4, 5, 6, 7, 8, 9, 10, 11, 12, 13, 14, 15 or 16, further including discharging a capacitor via the transistor.

Example 18

A circuit for controlling current through a transistor, the circuit including:
a voltage measurement circuit configured to measure a voltage across the transistor;
a current measurement circuit configured to measure a current through the transistor; and
a controller circuit configured to determine a safe operating current based on the measured voltage across the transistor, the controller circuit including a feedback circuit configured to adjust a voltage of a control node of the transistor until the measured current through the transistor is not greater than the determined safe operating current.

Example 19

The circuit of example 18, further including the transistor.

Example 20

The circuit of examples 18 or 19, wherein the current measurement circuit includes a resistor coupled in series with the transistor.

Example 21

The circuit of example 18, 19, 20 or 21, wherein the controller circuit includes a lookup table configured to determine the safe operating current.

Example 22

The circuit of example 21, wherein the lookup table includes entries of safe operating current with respect to the voltage across the transistor for continuous current conditions.

Example 23

The circuit of example 22, wherein the lookup table further includes entries of safe operating current with respect to the voltage across the transistor for transient voltage conditions.

Example 24

The circuit of example 18, 19, 20, 21, 22, or 23, wherein the controller is further configured to:
assert the voltage of the control node for a first time period; and
de-assert the voltage of the control node for a second time period after the first time period.

Example 25

The circuit of example 24, wherein the controller is configured to determine the safe operating current by determining the safe operating current according to the first time period.

Example 26

The circuit of examples 18, 19, 20, 21, 22, 23, 24 or 25, wherein the controller is configured to determine the safe operating current for a continuous current.

Example 27

The circuit of examples 18, 19, 20, 21, 22, 23, 24, 25 or 26, wherein the controller is further configured to:
calculate an estimated pulsed turn-on time of the transistor; and
determine the safe operating current according to the estimated pulsed turn-on time, wherein the safe operating current according to the estimated pulsed turn-on time is greater than the safe operating current for a continuous current.

Example 28

The circuit of examples 18, 19, 20, 21, 22, 23, 24, 25, 26 or 27, further including a temperature measurement circuit configured to measure a temperature of the transistor, wherein determining the safe operating current further includes determining the safe operating current based on the measured temperature.

Example 29

The circuit of example 28, wherein determining the safe operating current based on the measured temperature includes derating a reference safe operating current corresponding to a reference temperature.

Example 30

The circuit of examples 28 or 29, wherein determining the safe operating current includes using a lookup table.

Example 31

The circuit of example 30, wherein the lookup table includes entries of safe operating current with respect to a voltage across the transistor and with respect to the measured temperature.

Example 32

The circuit of examples 18, 19, 20, 21, 22, 23, 24, 25, 26, 27, 28, 29, 30 or 31, wherein the controller is further configured to:
compare the measured voltage across the transistor to a first voltage threshold; and
when the voltage across the transistor is less than the voltage first threshold, adjust the voltage of the control node of the transistor using the feedback circuit until the measured current through the transistor is not greater than a first target current, the first target current being less than the determined safe operating current.

Example 33

The circuit of example 32, wherein the controller is further configured to:
compare the measured voltage across the transistor to a second voltage threshold less than the first voltage threshold; and
when the voltage across the transistor is less than the second voltage threshold, adjust the voltage of the control node of the transistor using the feedback circuit until the measured current through the transistor is not greater than a second target current, the first target current being less than the second target current.

Example 34

The circuit of examples 18, 19, 20, 21, 22, 23, 24, 25, 26, 27, 28, 29, 30, 31, 32 or 33, further including a capacitor coupled to the transistor.

Example 35

The circuit of example 34, wherein the controller is further configured to activate the transistor to charge the capacitor.

Example 36

The circuit of examples 34 or 35, wherein the controller is further configured to activate the transistor to discharge the capacitor.

Example 37

An inrush current controller including:
a transistor having a load path configured to be coupled between a power supply and a load;
a current measurement circuit coupled the transistor, the current measurement circuit configured to measure a current through the load path of the transistor;
a voltage measurement circuit coupled to the transistor, the voltage measurement circuit configured to measure a voltage across the load path of the transistor;
a temperature measurement circuit thermally coupled to the transistor;
a safe operating area determination circuit having an input coupled to an output of the voltage measurement circuit and to an output of the temperature measurement circuit; and
a load current controller having an first input coupled to an output of the current measurement circuit, a second input coupled to an output of the safe operating area determination circuit, and an output coupled to a control node of the transistor.

Example 38

The inrush current controller of example 37, further including:
an analog-to-digital converter coupled between the current measurement circuit and the load current controller, coupled between the voltage measurement circuit and the safe operating area determination circuit, and coupled between the temperature measurement circuit and the safe operating area determination circuit; and
a digital-to-analog converter coupled between the load current controller and the control node of the transistor, wherein the load current controller and the safe operating area determination circuit are implemented using a digital controller.

Example 39

The inrush current controller of examples 37 or 38, wherein the load current controller includes a proportional-integral (PI) controller.

Example 40

The inrush current controller of examples 37, 38 or 39, further including an analog-to-digital converter coupled between the voltage measurement circuit and the safe operating area determination circuit, and coupled between the temperature measurement circuit and the safe operating area determination circuit.

Example 41

The inrush current controller of example 40, wherein the safe operating area determination circuit includes a lookup table.

Example 42

The inrush current controller of example 41, wherein the lookup table includes entries including a first plurality of safe operating direct currents for a corresponding plurality of measured load path voltages at a first temperature.

Example 43

The inrush current controller of example 42, wherein the lookup table further includes entries including a second plurality of safe operating transient currents for a corresponding plurality of measured load path voltages at the first temperature.

Example 44

The inrush current controller of example 42, wherein the lookup table further includes entries including a third plurality of safe operating transient currents for a corresponding plurality of measured load path voltages at a second temperature.

Example 45

The inrush current controller of examples 40, 41, 42, 43 and 44, further including a digital-to-analog converter coupled between safe operating area determination circuit and the load current controller.

Example 46

A method of operating a hot-swappable circuit including a series transistor and a capacitor coupled to a first load path terminal of the series transistor, the method including:
    connecting a second load path terminal of the series transistor to a power supply; and
    charging the capacitor via the series transistor, charging the capacitor including
        measuring a voltage across the series transistor,
        determining a safe operating current for the measured voltage across the series transistor,
        measuring a current through the series transistor, and
        adjusting a voltage of a control node of the series transistor using a feedback controller until the measured current through the series transistor is not greater than the determined safe operating current.

Example 47

The method of example 46, further including providing power from the power supply to a first circuit via the series transistor.

Example 48

A method of operating a power supply system, the method including:
    converting an AC voltage to a first DC voltage using an AC/DC converter;
    converting the first DC voltage to a second DC voltage using a DC/DC converter;
    disconnecting the AC/DC converter from the DC/DC converter; and
    discharging a capacitor coupled to an output of the AC/DC converter via a shunt transistor, discharging the capacitor including
        measuring a voltage across the shunt transistor,
        determining a safe operating current for the measured voltage across the shunt transistor,
        measuring a current through the shunt transistor, and
        adjusting a voltage of a control node of the shunt transistor using a feedback controller until the measured current through the shunt transistor is not greater than the determined safe operating current.

Advantages of embodiments of the present invention include the ability to limit inrush current within the safe operating area of a current limiting device in an inrush controller. Further advantages include the ability to use and automatically adapt to various values of load capacitance without needing recalibration in various embodiments. A further advantage includes the ability to use smaller and less expensive devices in inrush control circuits without having to necessarily oversize a device for a particular application. Yet another advantage of embodiment inrush control circuits includes the ability to use the inrush control circuit to provide active current limiting to the device without turning off the current limited device or destroying it.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of controlling current through a transistor, the method comprising:
    measuring a voltage across the transistor;
    measuring a current through the transistor;
    determining a safe operating current for the measured voltage across the transistor; and
    adjusting a voltage of a control node of the transistor using a feedback controller until the measured current through the transistor is not greater than the determined safe operating current.

2. The method of claim 1, wherein measuring the current through the transistor comprises measuring a voltage across a resistor coupled in series with a load path of the transistor.

3. The method of claim 1, further comprising pulsing the voltage of the control node, pulsing comprising:
    asserting the voltage of the control node for a first time period; and
    de-asserting the voltage of the control node for a second time period after the first time period, wherein de-asserting the voltage of the control node comprises providing a voltage to the control node that turns the transistor off.

4. The method of claim 3, wherein determining the safe operating current comprises determining the safe operating current according to the first time period.

5. The method of claim 1, wherein determining the safe operating current comprises determining the safe operating current for a continuous current.

6. The method of claim 1, further comprising:
    charging a capacitor via the transistor; or
    discharging the capacitor via the transistor.

7. The method of claim 1, wherein determining the safe operating current comprises using a lookup table.

8. A circuit for controlling current through a transistor, the circuit comprising:
    a voltage measurement circuit configured to measure a voltage across the transistor;
    a current measurement circuit configured to measure a current through the transistor; and
    a controller circuit configured to determine a safe operating current based on the measured voltage across the transistor, the controller circuit comprising a feedback circuit configured to adjust a voltage of a control node of the transistor until the measured current through the transistor is not greater than the determined safe operating current.

9. The circuit of claim 8, further comprising the transistor.

10. The circuit of claim 8, wherein the current measurement circuit comprises a resistor coupled in series with the transistor.

11. The circuit of claim 8, wherein the controller circuit comprises a lookup table configured to determine the safe operating current.

12. The circuit of claim 11, wherein the lookup table comprises entries of safe operating current with respect to the voltage across the transistor for continuous current conditions.

13. The circuit of claim 12, wherein the lookup table further comprises entries of safe operating current with respect to the voltage across the transistor for transient voltage conditions.

14. The circuit of claim 8, wherein the controller circuit is further configured to:
  assert the voltage of the control node for a first time period; and
  de-assert the voltage of the control node for a second time period after the first time period.

15. The circuit of claim 14, wherein the controller circuit is configured to determine the safe operating current by determining the safe operating current according to the first time period.

16. The circuit of claim 8, wherein the controller circuit is configured to determine the safe operating current for a continuous current.

17. The circuit of claim 8, further comprising a temperature measurement circuit configured to measure a temperature of the transistor, wherein determining the safe operating current further comprises determining the safe operating current based on the measured temperature.

18. The circuit of claim 17, wherein determining the safe operating current based on the measured temperature comprises derating a reference safe operating current corresponding to a reference temperature.

19. The circuit of claim 8, wherein the controller circuit is further configured to:
  compare the measured voltage across the transistor to a first voltage threshold; and
  when the voltage across the transistor is less than the voltage first threshold, adjust the voltage of the control node of the transistor using the feedback circuit until the measured current through the transistor is not greater than a first target current, the first target current being less than the determined safe operating current.

20. The circuit of claim 8, further comprising a capacitor coupled to the transistor, wherein the controller circuit is further configured to activate the transistor to charge the capacitor, and to activate the transistor to discharge the capacitor.

21. A method of operating a hot-swappable circuit comprising a series transistor and a capacitor coupled to a first load path terminal of the series transistor, the method comprising:
  connecting a second load path terminal of the series transistor to a power supply; and
  charging the capacitor via the series transistor, charging the capacitor comprising
    measuring a voltage across the series transistor,
    determining a safe operating current for the measured voltage across the series transistor,
    measuring a current through the series transistor, and
    adjusting a voltage of a control node of the series transistor using a feedback controller until the measured current through the series transistor is not greater than the determined safe operating current.

22. The method of claim 21, further comprising providing power from the power supply to a first circuit via the series transistor.

23. The method of claim 21, further comprising pulsing the voltage of the control node, pulsing comprising:
  asserting the voltage of the control node for a first time period; and
  de-asserting the voltage of the control node for a second time period after the first time period, wherein de-asserting the voltage of the control node comprises providing a voltage to the control node that turns the series transistor off.

24. The method of claim 23, wherein determining the safe operating current comprises determining the safe operating current according to the first time period.

25. The method of claim 21, wherein determining the safe operating current comprises using a lookup table.

26. The method of claim 25, wherein the lookup table comprises entries of safe operating current with respect to the voltage across the series transistor for continuous current conditions.

27. The method of claim 26, wherein the lookup table further comprises entries of safe operating current with respect to the voltage across the series transistor for transient voltage conditions.

* * * * *